(12) United States Patent
Ohashi et al.

(10) Patent No.: US 9,666,477 B2
(45) Date of Patent: May 30, 2017

(54) METHOD OF MANUFACTURING SEMICONDUCTOR DEVICE

(71) Applicant: HITACHI KOKUSAI ELECTRIC INC., Tokyo (JP)

(72) Inventors: Naofumi Ohashi, Toyama (JP); Satoshi Takano, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 0 days.

(21) Appl. No.: 15/067,790

(22) Filed: Mar. 11, 2016

(65) Prior Publication Data
US 2016/0293480 A1 Oct. 6, 2016

(30) Foreign Application Priority Data

Mar. 30, 2015 (JP) ................. 2015-068999

(51) Int. Cl.
*H01L 21/66* (2006.01)
*H01L 21/768* (2006.01)

(52) U.S. Cl.
CPC .. *H01L 21/76816* (2013.01); *H01L 21/76819* (2013.01); *H01L 21/76843* (2013.01); *H01L 21/76864* (2013.01); *H01L 21/76879* (2013.01); *H01L 22/12* (2013.01)

(58) Field of Classification Search
CPC ........... H01L 21/76819; H01L 21/7684; H01L 22/12; H01L 27/76843
See application file for complete search history.

(56) References Cited

U.S. PATENT DOCUMENTS

| 5,893,050 | A | 4/1999 | Park et al. |
| 6,033,921 | A | 3/2000 | Dawson et al. |
| 8,420,528 | B2 | 4/2013 | Noguchi |
| 9,401,293 | B2 | 7/2016 | Kobata et al. |
| 2007/0232063 | A1* | 10/2007 | Frohberg ......... H01L 21/76801 438/672 |
| 2008/0169571 | A1 | 7/2008 | Izumi |

FOREIGN PATENT DOCUMENTS

| JP | 02-262331 A | 10/1990 |
| JP | 07-066291 A | 3/1995 |
| JP | 09-143722 A | 6/1997 |
| JP | 2010-108953 A | 5/2010 |
| JP | 2012-138442 A | 7/2012 |
| KR | 10-2008-0067977 A | 7/2008 |

OTHER PUBLICATIONS

Korean Office Action issued on Jan. 1, 2017 in the Korean Application No. 10-2016-0029523.

* cited by examiner

*Primary Examiner* — Amar Movva
(74) *Attorney, Agent, or Firm* — Volpe and Koenig, P.C.

(57) ABSTRACT

A method of manufacturing a semiconductor device includes forming a first insulating film as a portion of a laminated insulating film on a substrate in which a plurality of circuit configurations is formed; polishing the first insulating film; measuring a film thickness distribution of the first insulating film; and forming a second insulating film as a portion of the laminated insulating film on the polished first insulating film at a film thickness distribution differing from the film thickness distribution of the first insulating film to correct a film thickness of the laminated insulating film.

18 Claims, 29 Drawing Sheets

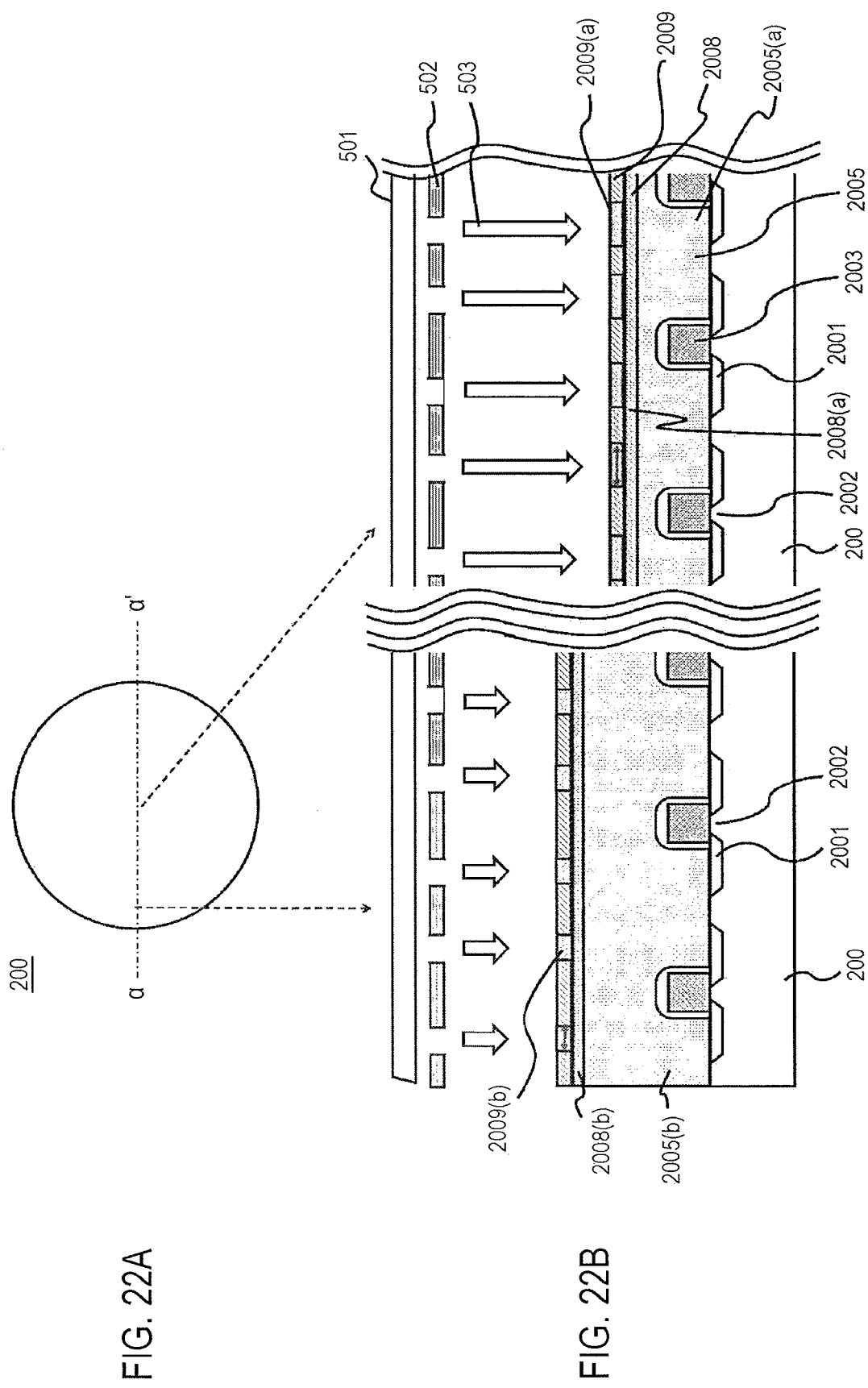

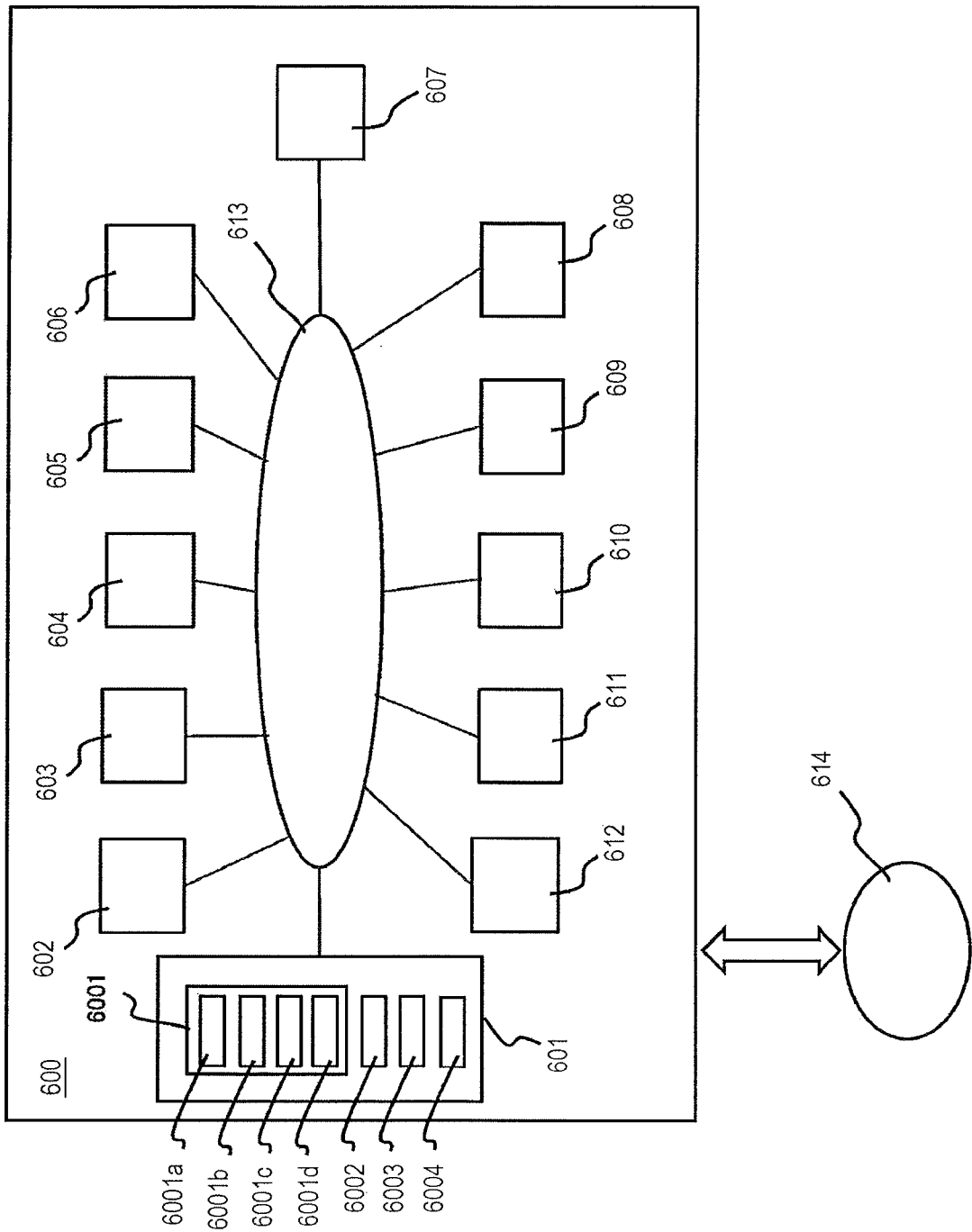

FIG. 26

|  |  | Mass flow controller | | | |
| --- | --- | --- | --- | --- | --- |
|  |  | 241b | 242b | 251b | 252b |
| First insulating film distribution | Distribution A | α101 | α102 | α103 | α104 |
| | Distribution B | β101 | β102 | β103 | β104 |

FIG. 27

| | | Mass flow controller | | | | | | | |
|---|---|---|---|---|---|---|---|---|---|
| | | 241b | 243c | 242b | 244c | 251b | 253c | 252b | 254c |
| First insulating film distribution | Distribution A | α201 | α202 | α203 | α204 | α205 | α206 | α207 | α208 |
| | Distribution B | β201 | β202 | β203 | β204 | β205 | β206 | β207 | β208 |

FIG. 28

| | | Mass flow controller | | | | Heater | |
|---|---|---|---|---|---|---|---|
| | | 241b | 242b | 251b | 252b | 213a | 213b |
| First insulating film distribution | Distribution A | α301 | α302 | α303 | α304 | α305 | α306 |
| | Distribution B | β301 | β302 | β303 | β304 | β305 | β306 |

FIG. 29

| First insulating film distribution | | Mass flow controller | | | | | | | | Heater | |
|---|---|---|---|---|---|---|---|---|---|---|---|
| | | 241b | 243c | 242b | 244c | 251b | 253c | 252b | 254c | 213a | 213b |
| | Distribution A | α401 | α402 | α403 | α404 | α405 | α406 | α407 | α408 | α409 | α410 |
| | Distribution B | β401 | β402 | β403 | β404 | β405 | β406 | β407 | β408 | β409 | β410 |

METHOD OF MANUFACTURING SEMICONDUCTOR DEVICE

CROSS-REFERENCE TO RELATED APPLICATION

This application is based upon and claims the benefit of priority from Japanese Patent Application No. 2015-068999, filed on Mar. 30, 2015, the entire contents of which are incorporated herein by reference.

TECHNICAL FIELD

The present disclosure relates to a method of manufacturing a semiconductor device, a substrate processing system, and a substrate processing apparatus.

BACKGROUND

Recently, semiconductor devices tend to be highly integrated. In line with the tendency of high integration of semiconductor devices, pattern sizes have been remarkably miniaturized. The patterns are formed through a hard mask or resist forming process, a lithography process, an etching process and the like. When forming the patterns, a variation in the characteristics of the semiconductor devices should be prevented.

However, a variation in a distance between circuits to be formed on a substrate may occur due to processing problems. In particular, such a variation may significantly affect the characteristics of semiconductor devices with miniaturized patterns.

SUMMARY

The present disclosure provides some embodiments of a technique capable of suppressing a variation in characteristics of a semiconductor device.

According to one embodiment of the present disclosure, there is provided a technique including: forming a first insulating film as a portion of a laminated insulating film on a substrate in which a plurality of circuit configurations is formed; polishing the first insulating film; measuring a film thickness distribution of the first insulating film; and forming a second insulating film as a portion of the laminated insulating film on the polished first insulating film at a film thickness distribution differing from the film thickness distribution of the first insulating film to correct a film thickness of the laminated insulating film.

BRIEF DESCRIPTION OF THE DRAWINGS

FIGS. 22A and 22B are explanatory views illustrating a processing state of a wafer according to a comparative example.

FIG. 25 is an explanatory view illustrating a system according to an embodiment.

FIG. 26 is a table illustrating a relationship between distributions of a first insulating film and control values of individual mass flow controllers.

FIG. 27 is a table illustrating a relationship between distributions of a first insulating film and control values of individual mass flow controllers.

FIG. 28 is a table illustrating a relationship between distributions of a first insulating film, control values of individual mass flow controllers and control values of individual heaters.

FIG. 29 is a table illustrating a relationship between distributions of a first insulating film, control values of individual mass flow controllers and control values of individual heaters.

DETAILED DESCRIPTION

Embodiments of the present disclosure will now be described.

Figure 1:
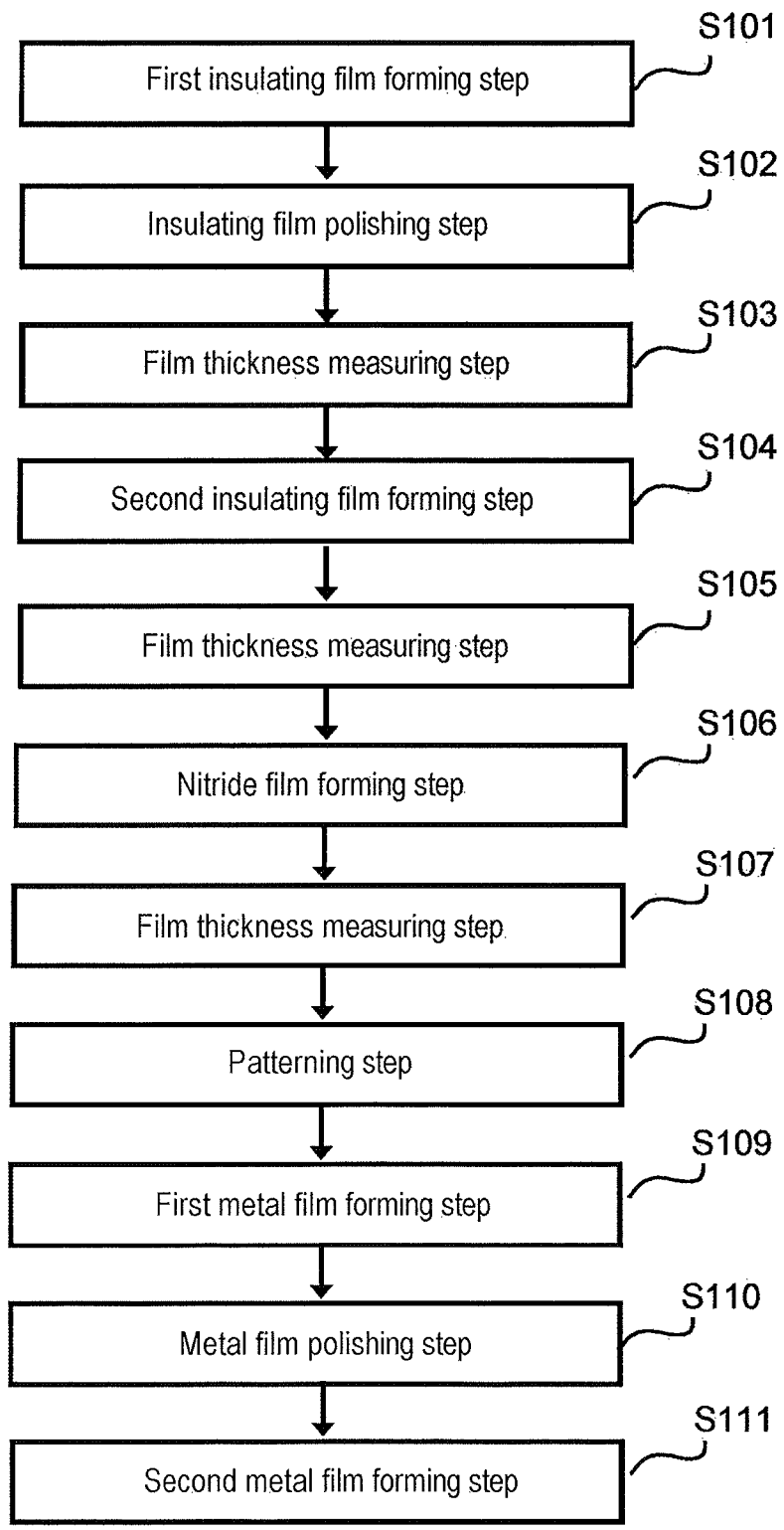
FIG. 1 is an explanatory view illustrating a manufacturing flow of a semiconductor device according to an embodiment.

One of processes of manufacturing a semiconductor device will be described with reference to FIG. 1.

(First Insulating Film Forming Step S101)

Figure 2:
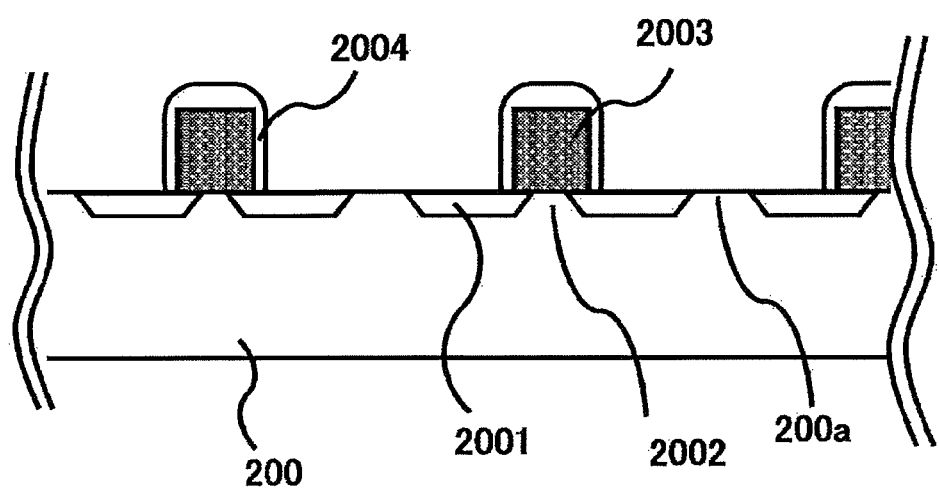
FIG. 2 is an explanatory view of a wafer according to an embodiment.
Figure 3:
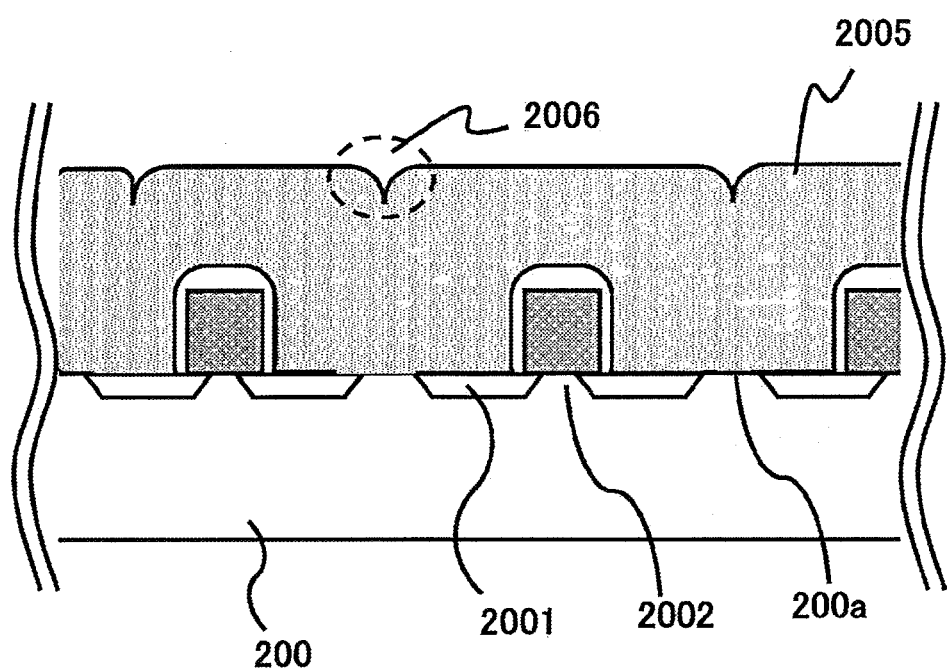
FIG. 3 is an explanatory view illustrating a processing state of a wafer according to an embodiment.

With regard to a first insulating film forming step S101, a wafer 200 will be described with reference to FIGS. 2 and 3. FIG. 2 illustrates a state before an insulating film is formed.

Source/drain regions 2001, each of which is configured by a source or a drain, are formed in the wafer 200. Channel regions 2002 are formed between the source/drain regions 2001. On a surface 200a of the wafer 200, gate electrodes 2003 are formed above the respective channel regions 2002. Outer walls 2004 serving to suppress a current flow from sidewalls of the gate electrodes 2003 are formed around the gate electrodes 2003. The source/drain regions 2001 and the gate electrodes 2003 are used as a part of a circuit configuration of a semiconductor device.

Subsequently, the first insulating film forming step S101 will be described with reference to FIG. 3. If the wafer 200 is loaded into a substrate processing apparatus (first-insulating-film forming apparatus) which forms a first insulating film, a silicon-containing gas and an oxygen-containing gas are supplied into a process chamber of the substrate processing apparatus. The gases thus supplied react within the process chamber to form a first interlayer insulating film 2005 (simply referred to as an insulating film 2005) which insulates circuits or electrodes adjoining each other. The insulating film 2005 is formed of, e.g., a silicon oxide film ($SiO_2$ film). The silicon-containing gas may be, e.g., a TEOS (tetraethyl orthosilicate, $Si(OC_2H_5)_4$) gas. The oxygen-containing gas may be, e.g., an oxygen gas ($O_2$).

If the insulating film 2005 is formed after a desired time is elapsed, the wafer 200 is unloaded from the substrate processing apparatus (first-insulating-film forming apparatus). The insulating film 2005 is used as an interlayer insulating film.

The insulating film 2005 formed by the first-insulating-film forming apparatus will now be described with reference to FIG. 3. As already described, a plurality of gate electrodes 2003 having a convex shape is formed in the wafer 200. In the case where a film is formed on the wafer 200 of this state, the heights from the substrate surface 200a to the upper end of the insulating film 2005 are not aligned with each other. Thus, the heights from the substrate surface 200a to the upper end of the insulating film 2005 vary in the plane of the wafer 200. For example, the height of the insulating film formed between the gate electrodes 2003 becomes smaller than the height of the insulating film formed on the gate electrodes 2003. Consequently, dents 2006 are formed. The wafer 200 is unloaded from the process chamber after the insulating film 2005 is formed.

However, in view of the relationship between a patterning step S108 and either or both of a first metal film forming step S110 and a second metal film forming step S111 which will be described later, there is required a state in which the dents 2006 do not exist. Thus, in order to eliminate the dents 2006, the insulating film 2005 is polished in the next polishing step S102.

(Insulating Film Polishing Step S102)

Next, an insulating film polishing step S102 of polishing the insulating film 2005 will be described. The polishing step is also referred to as a CMP (Chemical Mechanical Polishing) step. The wafer 200 unloaded from the first-insulating-film forming apparatus is loaded into a polishing apparatus 400.

Details of the polishing step will be described below. After unloaded from the first-insulating-film forming apparatus, the wafer 200 is loaded into the polishing apparatus 400 illustrated in FIG. 4.

Figure 4:
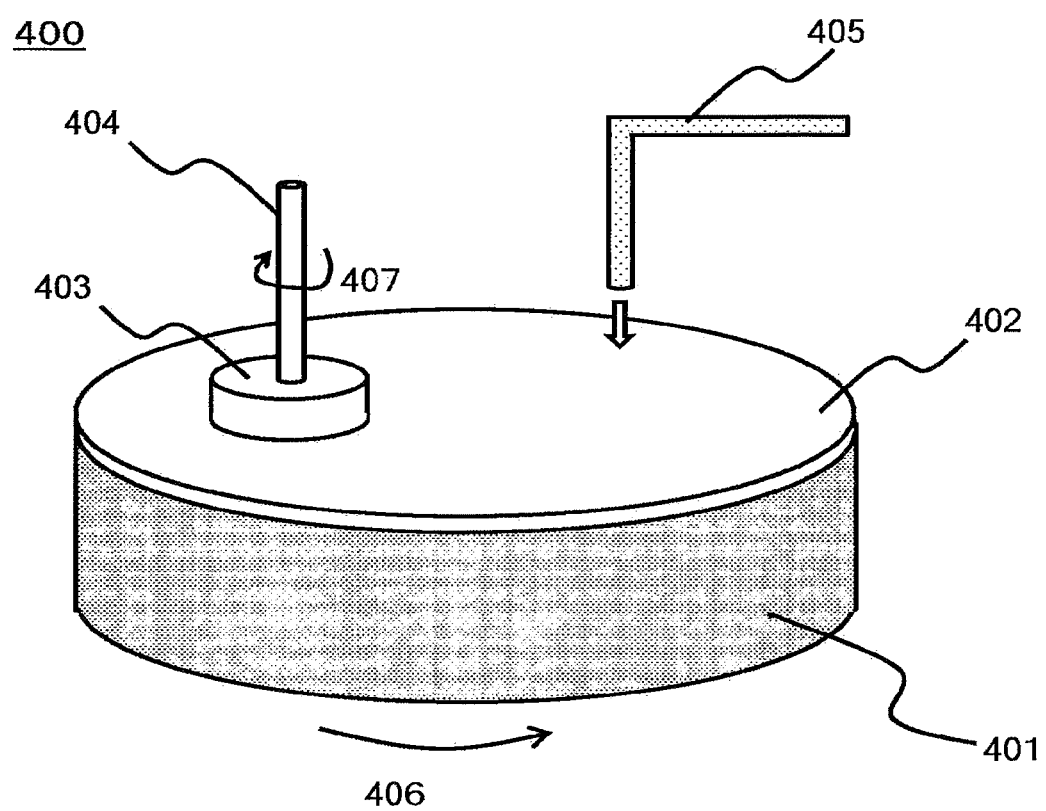
FIG. 4 is an explanatory view illustrating a polishing apparatus according to an embodiment.

In FIG. 4, reference numeral 401 denotes a polishing disc and reference numeral 402 denotes an abrasive cloth which polishes the wafer 200. The polishing disc 401 is connected to a rotation mechanism (not shown). When polishing the wafer 200, the polishing disc 401 rotates in a direction of an arrow 406.

Reference numeral 403 denotes a polishing head. A shaft 404 is connected to an upper surface of the polishing head 403. The shaft 404 is connected to a rotation mechanism and a vertical drive mechanism (not shown). While polishing the wafer 200, the shaft 404 rotates in a direction of an arrow 407.

Reference numeral 405 denotes a supply pipe configured to supply slurry (abrasive). While the wafer 200 is being polished, the slurry is supplied from the supply pipe 405 to the abrasive cloth 402.

Figure 5:
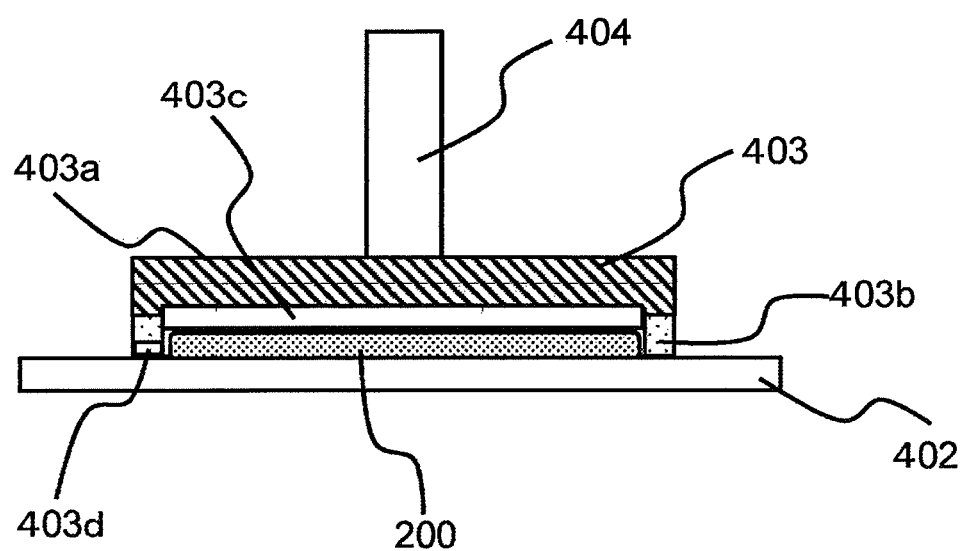
FIG. 5 is an explanatory view illustrating a polishing apparatus according to an embodiment.

Subsequently, details of the polishing head 403 and a peripheral structure thereof will be described with reference to FIG. 5. FIG. 5 is a cross-sectional view illustrating the polishing head 403 and a peripheral structure thereof. The polishing head 403 includes a top ring 403a, a retainer ring 403b and an elastic mat 403c. While the wafer 200 is being polished, the outer side of the wafer 200 is surrounded by the retainer ring 403b and the wafer 200 is pushed against the abrasive cloth 402 by the elastic mat 403c. Grooves 403d are formed in the retainer ring 403b to allow the slurry to pass through the grooves 403d from an outer side of the retainer ring to an inner side thereof. The grooves 403d are formed in a plural number along a circumferential direction in conformity with the shape of the retainer ring 403b. Used slurry is replaced by unused fresh slurry through the grooves 403d.

Figure 6:
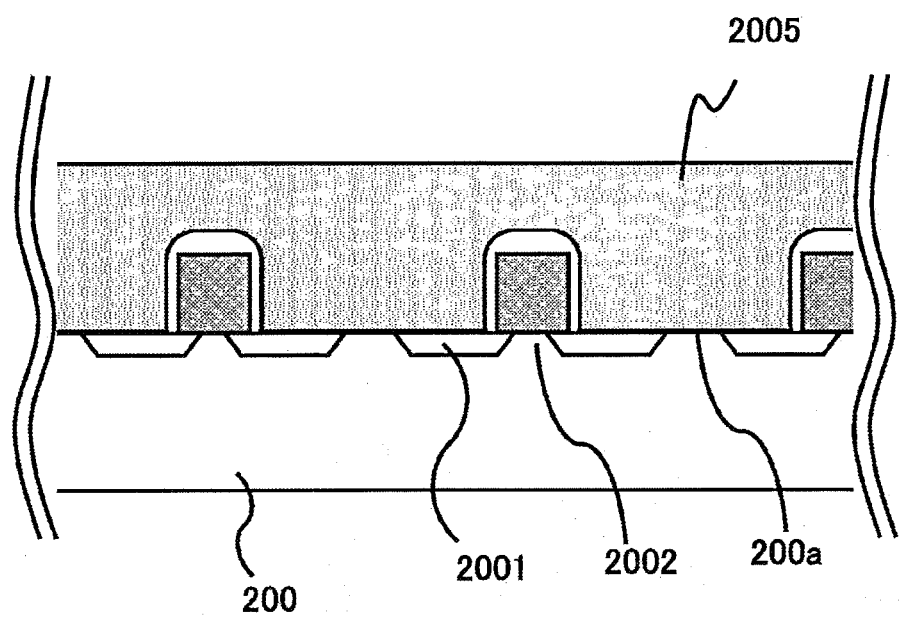
FIG. 6 is an explanatory view illustrating a processing state of a wafer according to an embodiment.

Subsequently, an operation at this step will be described. When the wafer 200 is loaded into the polishing head 403, the slurry is supplied from the supply pipe 405 and the polishing disc 401 and the polishing head 403 are rotated. The slurry flows into the retainer ring 403b to polish a surface of the wafer 200. Through this polishing, as illustrated in FIG. 6, the heights of the insulating film 2005 can be aligned with each other. After the wafer 200 is polished for a predetermined period of time, the wafer 200 is unloaded from the polishing apparatus 400. The term "height" used herein refers to a height from the wafer surface 200a to the upper end of the insulating film 2005, namely to the surface of the insulating film 2005.

Figure 7:
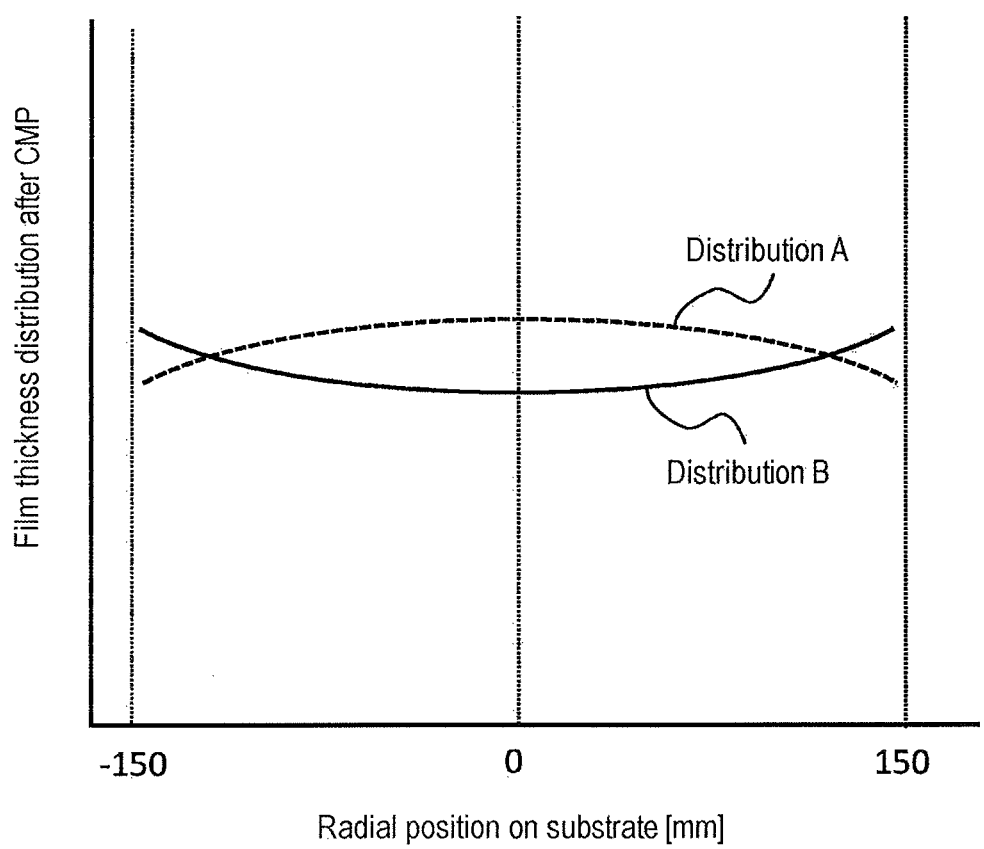
FIG. 7 is an explanatory view illustrating a thickness distribution of an insulating film after a polishing step according to an embodiment.

It has been found that even if the wafer 200 is polished by the CMP apparatus 400 to align the heights of the insulating film 2005, the heights of the insulating film may not be aligned in the plane of the wafer 200 as illustrated in FIG. 7. For example, it has been found that there may appear distribution A in which a film thickness of a peripheral surface of the wafer 200 is smaller than a film thickness of a central surface thereof or distribution B in which a film thickness of a central surface of the wafer 200 is smaller than a film thickness of a peripheral surface thereof.

When there is a bias in the film thickness distribution, a problem is posed in that a variation in a width of a pattern is generated at a patterning step which will be described later. Similarly, a problem is posed in that a variation in a height from the wafer surface 200a to a metal film surface is generated at a first metal film forming step which will be described later. Due to these problems, a variation in the characteristics of a metal film is generated, which may result in a reduction of yield rate.

According to the results of extensive researches on this problem conducted by the inventors, it has been found that distribution A and distribution B have their own causes. The causes will be described hereinafter.

The cause of distribution A resides in a supply method of slurry with respect to the wafer 200. As set forth above, the slurry supplied to the abrasive cloth 402 is supplied from the periphery of the wafer 200 through the retainer ring 403b. Thus, the slurry used to polish the peripheral surface of the wafer 200 flows toward the central surface of the wafer 200, while fresh slurry flows onto the peripheral surface of the wafer 200. Since the fresh slurry has high polishing efficiency, the peripheral surface of the wafer 200 is polished more heavily than the central surface of the wafer 200. It has been found from the foregoing that the film thickness of the insulating film 2005 has distribution A.

The cause of distribution B resides in the wear of the retainer ring 403b. When a large amount of wafers 200 are polished by the polishing apparatus 400, a front end of the retainer ring 403b pressed against the abrasive cloth 402 is worn and the grooves 403d or the surface of the retainer ring 403b making contact with the abrasive cloth 402 is deformed. For this reason, slurry to be supplied may not be supplied to an inner circumference of the retainer ring 403b. In this case, the slurry is not supplied to the peripheral surface of the wafer 200. Therefore, the central surface of the wafer 200 is polished while the peripheral surface thereof is not polished. Thus, it has been found that the film thickness of the insulating film 2005 has distribution B.

Accordingly, in the present embodiment, as will be described later, a step of polishing the insulating film 2005 on the wafer 200 by the polishing apparatus 400 and subsequently aligning the heights of a laminated insulating film in the substrate plane is performed. The term "laminated insulating film" used herein refers to a film obtained by overlapping a below-described insulating film 2007 with the insulating film 2005. In other words, the laminated insulating film includes the insulating film 2005 as a portion thereof and includes the insulating film 2007 as another portion thereof.

As a specific method for aligning the heights, a film thickness distribution of the insulating film 2005 is measured at a film thickness measuring step S103 after the polishing step S102, and a second insulating film forming step S104 is executed according to the measurement data. By doing so, a variation in a width of a pattern is suppressed at a patterning step which will be described later. Similarly, a variation in a height from the wafer surface 200a to a surface of a metal film is suppressed at a first metal film forming step which will be described later.

(Film Thickness Measuring Step S103)

Subsequently, the film thickness measuring step S103 will be described. At the film thickness measuring step S103, the film thickness of the insulating film 2005 which has been subjected to the polishing is measured using a measuring apparatus. Since a general measuring apparatus can be used as the measuring apparatus, a detailed description thereof will be omitted. The term "film thickness" used herein refers to, for example, a height from the wafer surface 200a to the surface of the insulating film 2005.

After the polishing step S102, the wafer 200 is loaded into the measuring apparatus. The measuring apparatus measures a film thickness (height) distribution of the insulating film 2005 by measuring film thicknesses of at least some points of the central surface and the peripheral surface of the wafer 200 that may be easily affected by the polishing apparatus 400. The measurement data are transmitted to a below-described substrate processing apparatus 900 via a host device. After the measurement, the wafer 200 is unloaded from the measuring apparatus.

(Second Insulating Film Forming Step S104)

Subsequently, a second insulating film forming step will be described. The second insulating film is identical in component and composition with the first insulating film 2005. At this step, as illustrated in FIGS. 8A and 8B or FIGS. 10A and 10B, a second interlayer insulating film 2007 (also referred to as an insulating film 2007 or a correction film) is formed on the first insulating film 2005 which has been subjected to the polishing. In the subject specification, a film obtained by overlapping the first insulating film 2005 and the second insulating film 2007 with each other is referred to as a laminated insulating film.

The second interlayer insulating film 2007 is formed so as to correct the film thickness distribution of the first interlayer insulating film 2005 which has been subjected to the polishing. More preferably, the insulating film 2007 is formed to align the surface heights of the insulating film 2007. The term "height" used herein refers to a surface height of the insulating film 2007, namely a distance from the wafer surface 200a to the surface of the insulating film 2007.

Figure 8:
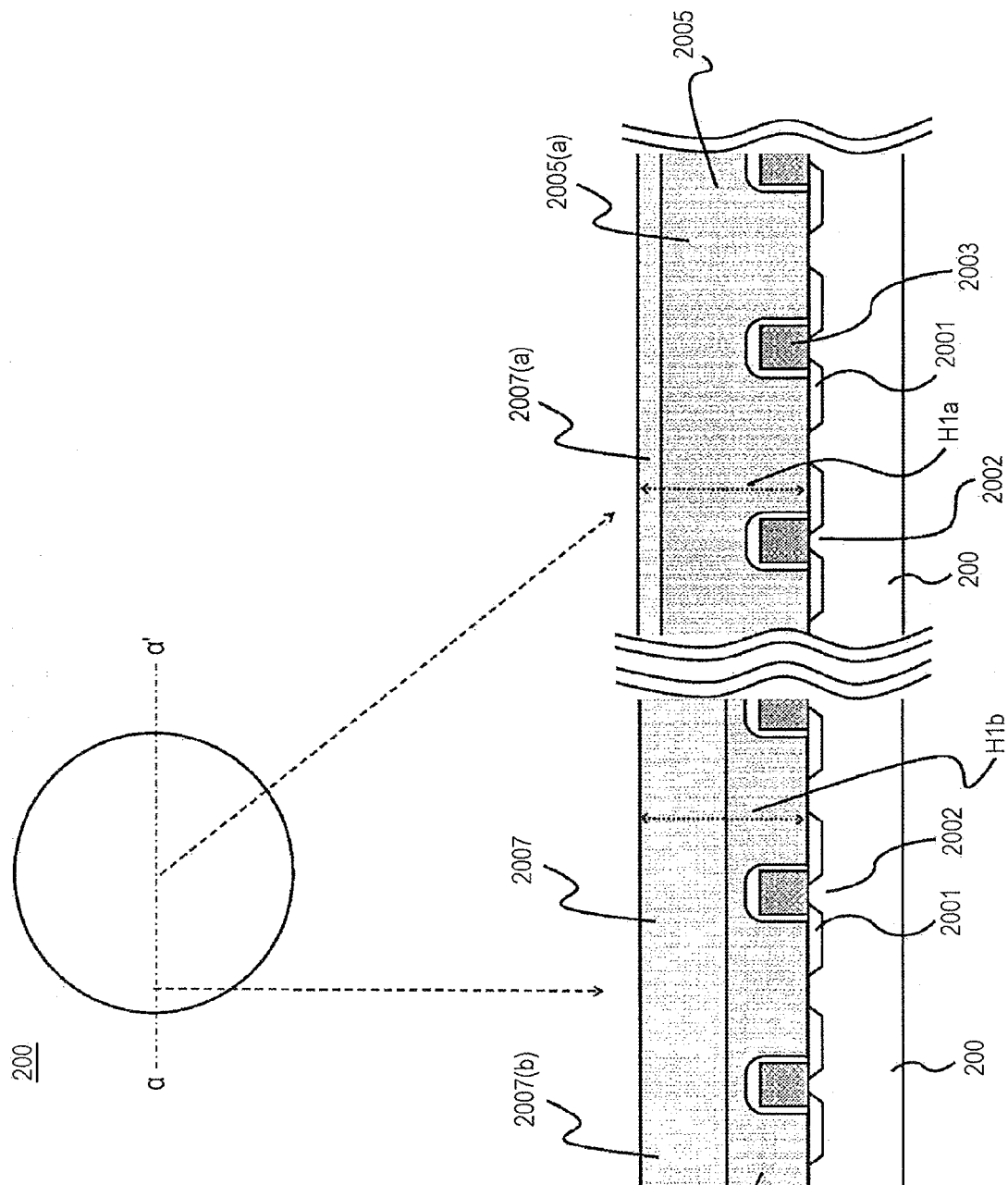
FIGS. 8A and 8B are explanatory views illustrating a processing state of a wafer according to an embodiment.
Figure 9:
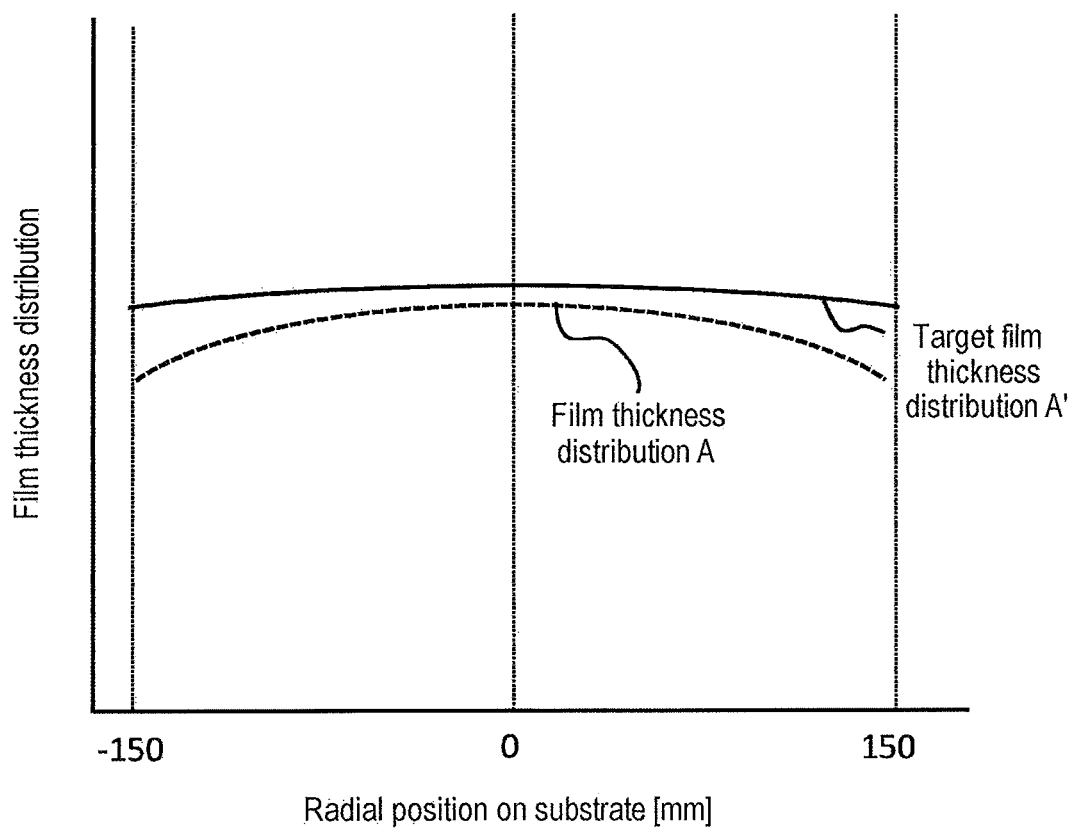
FIG. 9 is an explanatory view illustrating a thickness distribution of an insulating film according to an embodiment.
Figure 10A:
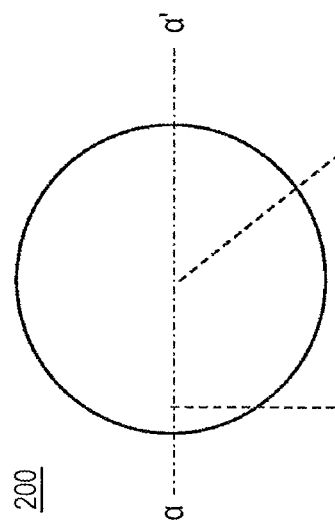
FIGS. 10A and 10B are explanatory views illustrating a processing state of a wafer according to an embodiment.
Figure 10B:
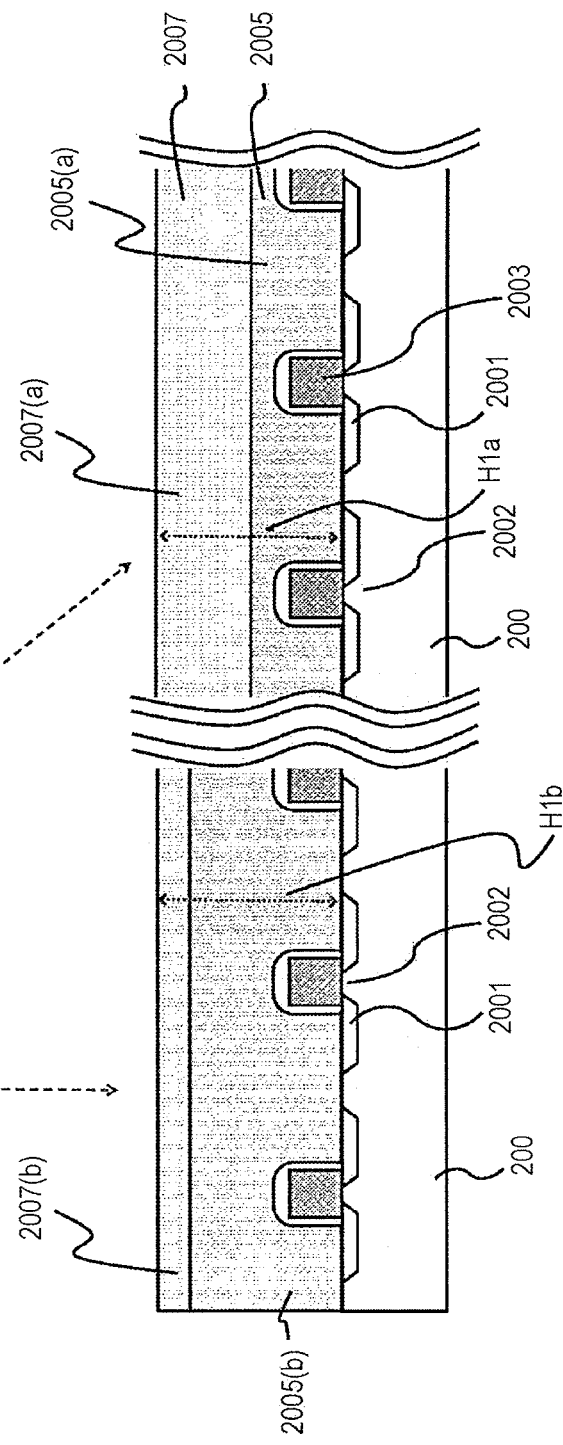
Figure 11:
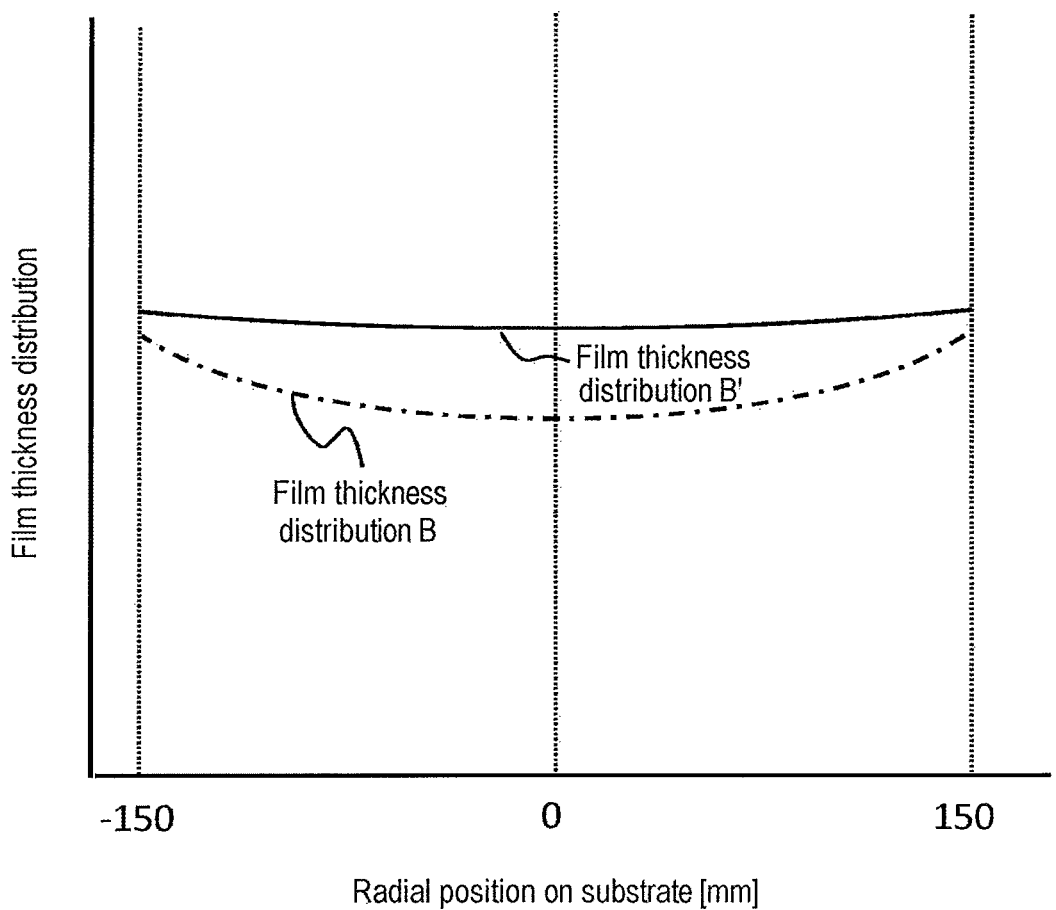
FIG. 11 is an explanatory view illustrating a thickness distribution of an insulating film according to an embodiment.

Hereinafter, this step will be described with reference to FIGS. 8A to 16. FIGS. 8A and 8B are views illustrating the insulating film 2007 formed at this step when the first insulating film 2005 has distribution A. FIG. 9 is an explanatory view illustrating film thickness distribution A and corrected film thickness distribution A'. FIGS. 10A and 10B are views illustrating the insulating film 2007 formed at this step when the first insulating film 2005 has distribution B. FIG. 11 is an explanatory view illustrating film thickness distribution B and corrected film thickness distribution B'. FIGS. 12 to 16 are views illustrating a substrate processing apparatus for realizing this step.

FIG. 8A is a top view illustrating the wafer 200 available after the insulating film 2007 is formed. FIG. 8B is a view illustrating the center and outer periphery of the wafer 200 excerpted from a cross-section taken along line α-α' in FIG. 8A in the case of film thickness distribution A.

FIG. 10A is a top view illustrating the wafer 200 available after the insulating film 2007 is formed. FIG. 10B is a view illustrating the center and outer periphery of the wafer 200 excerpted from a cross-section taken along line α-α' in FIG. 10A in the case of film thickness distribution B.

In the subject specification, the first insulating film existing on the central surface of the wafer 200 will be referred to as an insulating film 2005a and the second insulating film existing on the central surface of the wafer 200 will be referred to as an insulating film 2007a. The first insulating film existing on the peripheral surface of the wafer 200 will be referred to as an insulating film 2005b and the second insulating film existing on the peripheral surface of the wafer 200 will be referred to as an insulating film 2007b.

Figure 12:
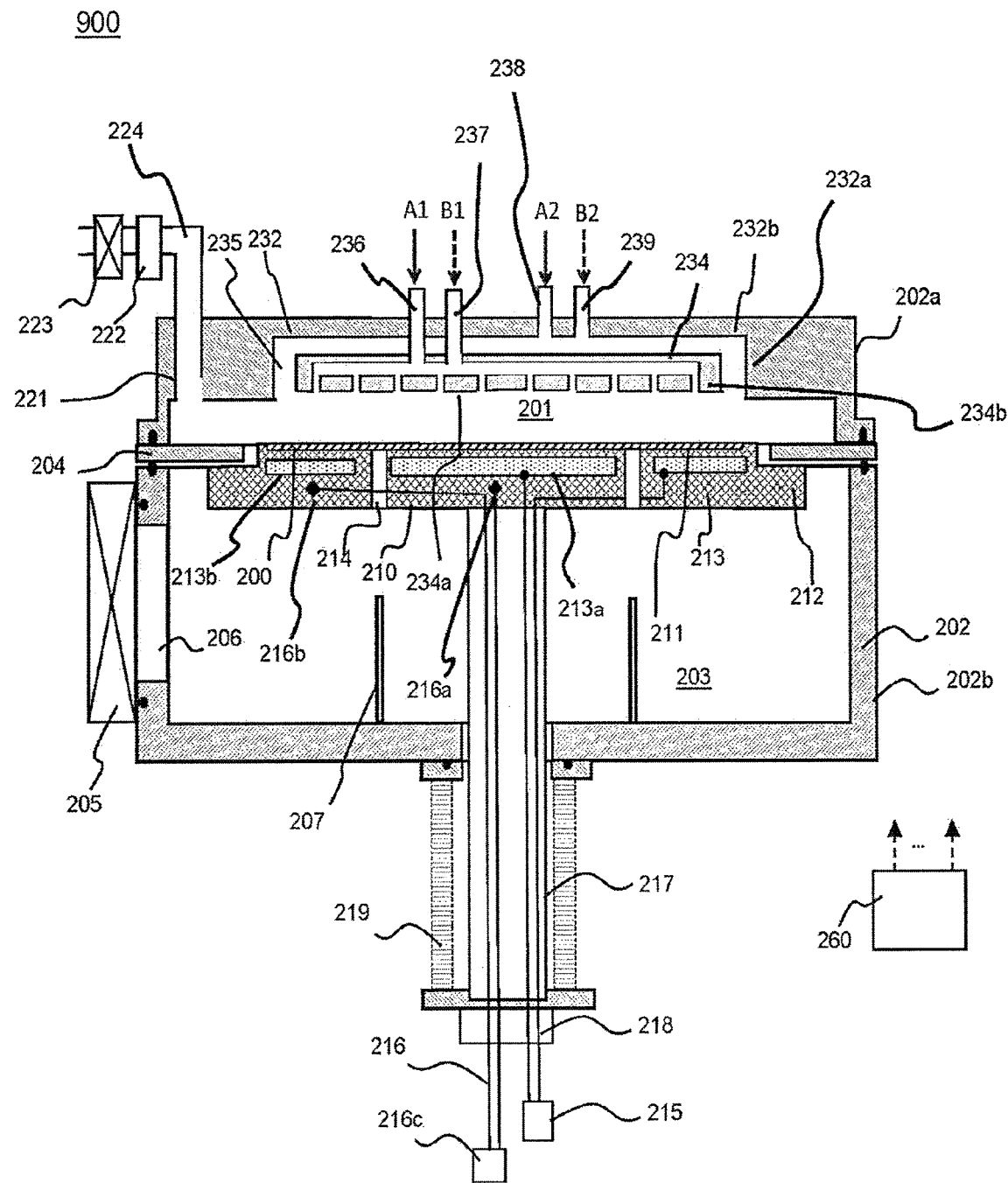
FIG. 12 is an explanatory view illustrating a substrate processing apparatus according to an embodiment.

The wafer 200 unloaded from the measuring apparatus is loaded into the substrate processing apparatus 900 as a second-insulating-film forming apparatus illustrated in FIG. 12.

The substrate processing apparatus 900 controls the film thickness of the insulating film 2007 in the substrate plane based on the data measured at the film thickness measuring step S103. For example, if the data received from the host device are data indicative of distribution A, the substrate processing apparatus 900 controls the film thickness such that the thickness of the insulating film 2007b on the peripheral surface of the wafer 200 becomes larger and such that the insulating film 2007a on the central surface of the wafer 200 becomes thinner than the insulating film 2007b on the peripheral surface of the wafer 200. Furthermore, if the data received from the host device are data indicative of distribution B, the substrate processing apparatus 900 controls the film thickness such that the thickness of the insulating film 2007a on the central surface of the wafer 200 becomes larger and such that the insulating film 2007b on the peripheral surface of the wafer 200 becomes thinner than the insulating film 2007a on the central surface of the wafer 200.

More preferably, the thickness of the second insulating film 2007 is controlled such that the height of the laminated insulating film obtained by overlapping the first insulating film 2005 and the second insulating film 2007 with each other falls within a predetermined range in the wafer plane. In other words, the heights are aligned by controlling the film thickness distribution of the second insulating film 2007 such that the height distribution of the second insulating film 2007 in the substrate plane falls within a predetermined range. That is to say, as illustrated in FIGS. 8A, 8B, 10A and 10B, the height H1a from the wafer surface 200a to the upper end of the second insulating film 2007a on the central surface of the wafer 200 and the height H1b from the wafer surface 200a to the upper end of the second insulating film 2007b on the peripheral surface of the wafer 200 can be made equal to each other.

Next, the substrate processing apparatus 900 capable of controlling the film thickness of each of the insulating films 2007a and 2007b will be described in detail.

The substrate processing apparatus 900 according to the present embodiment will be described. As illustrated in FIG. 12, the substrate processing apparatus 900 is configured as a single-substrate-type substrate processing apparatus.

As shown in FIG. 12, the substrate processing apparatus 900 includes a process vessel 202. The process vessel 202 is configured as, e.g., a flat airtight vessel having a circular horizontal cross-section. Furthermore, the process vessel 202 is made of a metallic material such as, e.g., aluminum (Al) or stainless steel (SUS), or quartz. A process space (process chamber) 201, in which the wafer 200 such as a silicon wafer as a substrate is processed, and a transfer space 203 are formed in the process vessel 202. The process vessel 202 is configured by an upper vessel 202a and a lower vessel 202b. A partition plate 204 is installed between the upper vessel 202a and the lower vessel 202b. A space, which is surrounded by the upper vessel 202a and is provided above the partition plate 204, is referred to as the process space (also, referred to as a process chamber) 201. A space, which is surrounded by the lower vessel 202b and is provided below the partition plate 204, is referred to as the transfer space 203.

A substrate loading/unloading port 206 adjacent to a gate valve 205 is formed on a side surface of the lower vessel 202b. The wafer 200 moves into and out of a transfer chamber (not shown) through the substrate loading/unloading port 206. A plurality of lift pins 207 is installed in a bottom portion of the lower vessel 202b.

A substrate support part 210 configured to support the wafer 200 is installed in the process chamber 201. The substrate support part 210 includes a substrate mounting surface 211 on which the wafer 200 is mounted, and a substrate mounting stand 212 having the substrate mounting surface 211 on a surface thereof. Preferably, a heater 213 as a heating part is installed. By installing the heating part, it is possible to heat the substrate and to improve the quality of a film formed on the substrate. Through-holes 214 through which the lift pins 207 pass may be formed in the substrate mounting stand 212 in such positions corresponding to the lift pins 207, respectively.

The substrate mounting stand 212 is supported by a shaft 217. The shaft 217 passes through a bottom portion of the process vessel 202. Furthermore, the shaft 217 is connected to an elevator mechanism 218 outside the process vessel 202. By operating the elevator mechanism 218 to move the shaft 217 and the substrate mounting stand 212 up and down, the wafer 200 mounted on the substrate mounting surface 211 can be moved up and down. Further, the periphery of the lower end of the shaft 217 is covered with a bellows 219 so that the inside of the process vessel 202 is kept airtight.

When transferring the wafer 200, the substrate mounting stand 212 is moved down such that the substrate mounting surface 211 is located in a position of the substrate loading/unloading port 206 (or a wafer transfer position). When processing the wafer 200, as shown in FIG. 12, the substrate mounting stand 212 is moved up until the wafer 200 reaches a processing position (or a wafer processing position) within the process chamber 201.

Specifically, when the substrate mounting stand 212 is moved down to the wafer transfer position, the upper end portions of the lift pins 207 protrude from an upper surface of the substrate mounting surface 211 so that the lift pins 207 support the wafer 200 from below. Further, when the substrate mounting stand 212 is moved up to the wafer processing position, the lift pins 207 are retracted from the upper surface of the substrate mounting surface 211 so that the substrate mounting surface 211 supports the wafer 200 from below. In addition, the lift pins 207 are preferably made of a material such as, e.g., quartz, alumina or the like, because the lift pins 207 make direct contact with the wafer 200. Moreover, an elevator mechanism may be installed in the lift pins 207 such that the substrate mounting stand 212 and the lift pins 207 are moved relatively to each other.

The heater 213 has a configuration capable of individually heat-controlling the central surface which is the center of the wafer 200 and the peripheral surface which is the outer periphery of the wafer 200. For example, the heater 213 includes a central zone heater 213a installed at the center of the substrate mounting surface 211 and fox med in an annular shape when viewed from above and an outer zone heater 213b formed in an annular shape and installed in the periphery of the central zone heater 213a. The central zone heater 213a heats the central surface of the wafer 200. The outer zone heater 213b heats the peripheral surface of the wafer 200.

Each of the central zone heater 213a and the outer zone heater 213b is connected to a heater temperature control part 215 via a heater power supply line. The heater temperature control part 215 controls the temperatures of the central surface and the peripheral surface of the wafer 200 by controlling the power supply to each heater.

A temperature measuring instrument 216a and a temperature measuring instrument 216b for measuring a temperature of the wafer 200 are embedded in the substrate mounting stand 212. The temperature measuring instrument 216a is installed in a central portion of the substrate mounting stand 212 so as to measure a temperature in the vicinity of the central zone heater 213a. The temperature measuring instrument 216b is installed on a peripheral surface of the substrate mounting stand 212 so as to measure a temperature in the vicinity of the outer zone heater 213b. The temperature measuring instrument 216a and the temperature measuring instrument 216b are connected to a temperature information reception part 216c. The temperatures measured by the respective temperature measuring instruments are transmitted to the temperature information reception part 216c. The temperature information reception part 216c transmits the received temperature information to a controller 260 which will be described later. The controller 260 controls a heater temperature based on the received temperature information or the film thickness information received from a host device. Further, the temperature measuring instrument 216a, the temperature measuring instrument 216b and the temperature information reception part 216c is collectively called a temperature detecting part 216.

(Exhaust System)

An exhaust port 221 is formed on an upper surface of an inner wall of the process chamber 201 (the upper vessel 202a) so as to exhaust an atmosphere of the process chamber 201. An exhaust pipe 224 as a first exhaust pipe is connected to the exhaust port 221. A pressure regulator 222 such as an auto pressure controller (APC) for controlling the internal pressure of the process chamber 201 to a predetermined pressure and a vacuum pump 223 are serially connected to the exhaust pipe 224 in the named order. A first exhaust part (exhaust line) is mainly configured by the exhaust port 221, the exhaust pipe 224 and the pressure regulator 222. In addition, the vacuum pump 223 may be included in the first exhaust part.

(Buffer Chamber)

A buffer chamber 232 is installed above the process chamber 201. The buffer chamber 232 is defined by a sidewall 232a and a ceiling 232b. The buffer chamber 232 includes a shower head 234. A gas supply path 235 is defined between an inner wall 232a of the buffer chamber 232 and the shower head 234. That is to say, the gas supply path 235 is installed to surround a sidewall 234b of the shower head 234.

Figure 13:
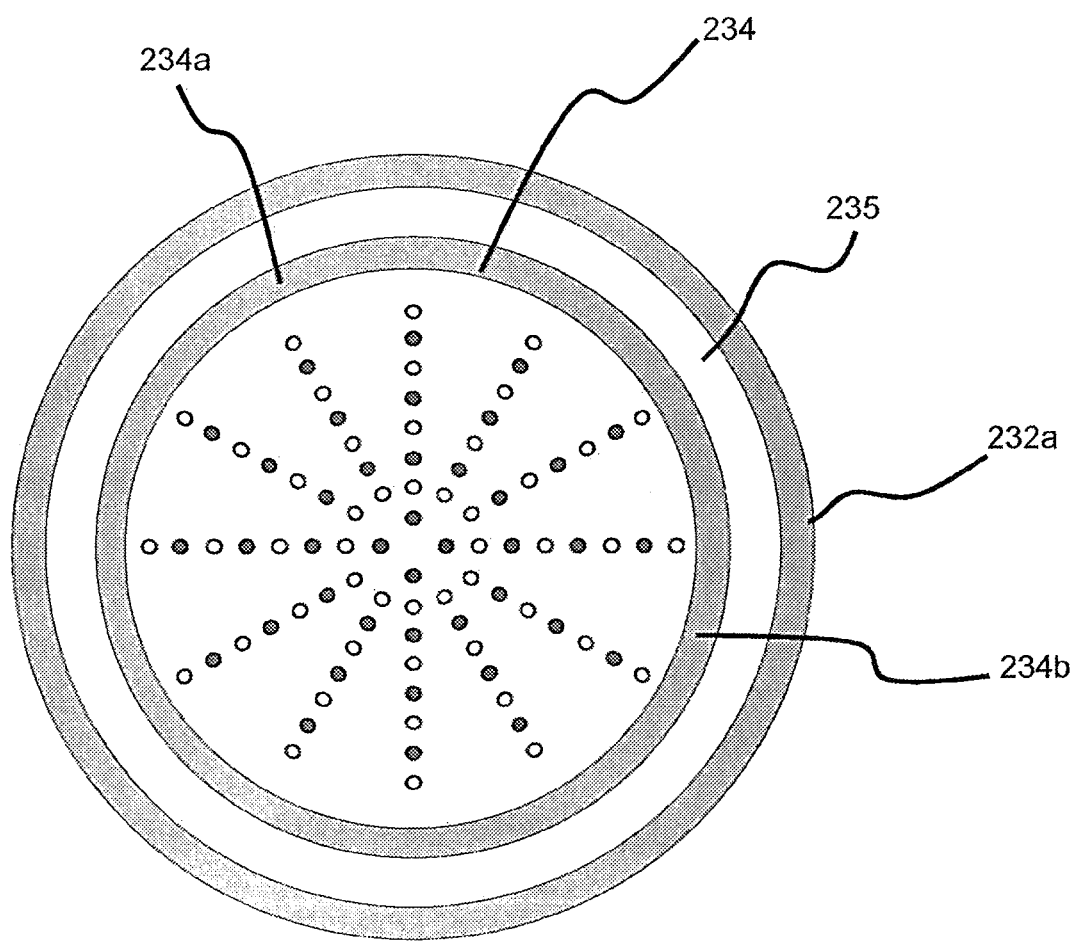
FIG. 13 is an explanatory view illustrating a shower head of a substrate processing apparatus according to an embodiment.

A dispersion plate 234a is installed in the wall that separates the shower head 234 and the process chamber 201. The dispersion plate 234a has, for example, a disc shape. When viewed from the side of the process chamber 201, the gas supply path 235 is positioned between the shower head sidewall 234b and the sidewall 232a and is installed around the dispersion plate 234a in a horizontal direction as illustrated in FIG. 13.

A gas introduction pipe 236 and a gas introduction pipe 237 extend through the ceiling 232b of the buffer chamber 232. Furthermore, a gas introduction pipe 238 and a gas introduction pipe 239 are connected to the ceiling 232b of the buffer chamber 232. The gas introduction pipe 236 and the gas introduction pipe 237 are connected to the shower head 234. The gas introduction pipe 236 and the gas introduction pipe 238 are connected to a first gas supply system which will be described later. The gas introduction pipe 237 and the gas introduction pipe 239 are connected to a second gas supply system which will be described later.

The gas introduced from the gas supply pipe 236 and the gas supply pipe 237 is supplied into the process chamber 201 via the shower head 234. The gas introduced from the gas supply pipe 238 and the gas supply pipe 239 is supplied into the process chamber 201 via the gas supply path 235.

The gas supplied from the shower head 234 is supplied to the center of the wafer 200. The gas supplied from the gas supply path 235 is supplied to the edge of the wafer 200. The peripheral surface (edge) of the wafer refers to a periphery with respect to the center of the wafer described above. The shower head 234 is made of a material such as, e.g., quartz, alumina, stainless steel, aluminum or the like.

With this configuration, the shower head 234 is installed in a position where the shower head 234 faces the central surface of the wafer 200 mounted on the substrate mounting surface 211. Thus, the gas supplied from the shower head 234 can be supplied to the central surface of the wafer 200. Furthermore, the gas supply path 235 is installed in a position where the gas supply path 235 faces the peripheral surface of the wafer 200. Thus, the gas supplied from the gas supply path 235 can be supplied to the peripheral surface of the wafer 200.

(Gas Supply System)

(First Gas Supply system)

Figure 14:
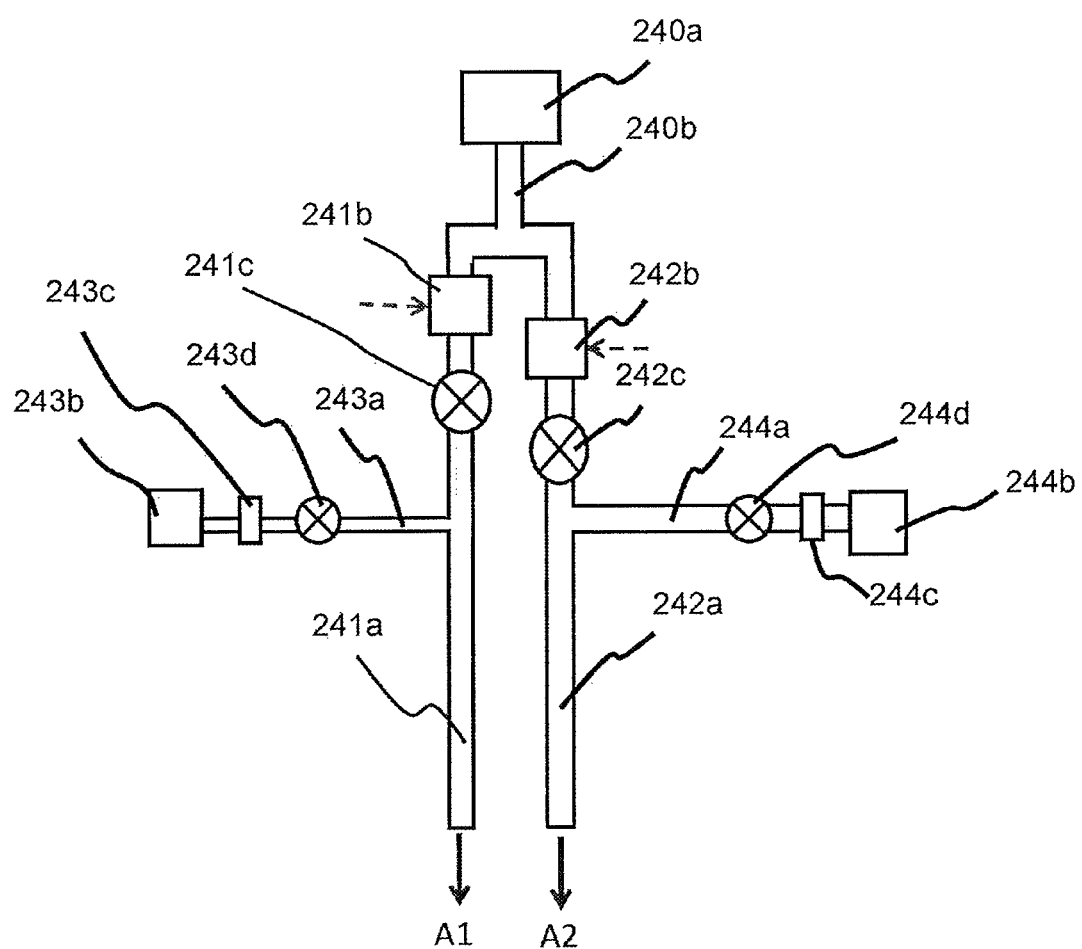
FIG. 14 is an explanatory view illustrating a gas supply system of a substrate processing apparatus according to an embodiment.

Next, a first gas supply system will be described with reference to FIG. 14. A1 indicated in FIG. 14 is connected to A1 indicated in FIG. 12. A2 indicated in FIG. 14 is connected to A2 indicated in FIG. 12. That is to say, a gas supply pipe 241a is connected to the gas introduction pipe 236. A gas supply pipe 242a is connected to the gas introduction pipe 238.

A junction pipe 240b, a mass flow controller 241b and a valve 241c are installed in the gas supply pipe 241a in the named order from the upstream side. A flow rate of a gas that passes through the gas supply pipe 241a is controlled by the mass flow controller 241b and the valve 241c. A gas source 240a of a first process gas is installed at the upstream side of the junction pipe 240b. The first process gas is a silicon-containing gas. For example, disilane ($Si_2H_6$) is used as the first process gas.

Preferably, a first inert gas supply pipe 243a for supplying an inert gas is connected to the downstream side of the valve 241c. An inert gas source 243b, a mass flow controller 243c and a valve 243d are installed in the inert gas supply pipe 243a in the named order from the upstream side. As the inert gas, for example, a helium (He) gas is used. The inert gas is added to the gas flowing through the gas supply pipe 241a and is used as a dilution gas. A concentration or a flow rate of the process gas supplied through the gas introduction pipe 236 and the shower head 234 may be more optimally tuned by controlling the mass flow controller 243c and the valve 243d.

A junction pipe 240b, a mass flow controller 242b and a valve 242c are installed in the gas supply pipe 242a connected to the gas introduction pipe 238, in the named order from the upstream side. A flow rate of a gas that passes through the gas supply pipe 242a is controlled by the mass flow controller 242b and the valve 242c. The gas source 240a of the first process gas is installed at the upstream side of the junction pipe 240b.

Preferably, a second inert gas supply pipe 244a for supplying an inert gas is connected to the downstream side of the valve 242c. An inert gas source 244b, a mass flow controller 244c and a valve 244d are installed in the inert gas supply pipe 244a in the named order from the upstream side. As the inert gas, for example, a helium (He) gas is used. The inert gas is added to the gas flowing through the gas supply pipe 242a and is used as a dilution gas. A concentration or a flow rate of the gas flowing through the gas introduction pipe 238 and the gas supply path 235 may be more optimally tuned by controlling the mass flow controller 244c and the valve 244d.

The gas supply pipe 241a, the mass flow controller 241b, the valve 241c, the gas supply pipe 242a, the mass flow controller 242b, the valve 242c and the junction pipe 240b are collectively referred to as a first gas supply system.

Furthermore, the gas source 240a, the gas introduction pipe 236 and the gas introduction pipe 238 may be included in the first gas supply system.

The first inert gas supply pipe 243a, the mass flow controller 243c, the valve 243d, the second inert gas supply pipe 244a, the mass flow controller 244c and the valve 244d are collectively referred to as a first inert gas supply system. Furthermore, the inert gas source 243b and the inert gas source 244b may be included in the first inert gas supply system. Moreover, the first inert gas supply system may be included in the first gas supply system.

In the present embodiment, the gas supply pipe 241a is referred to as a first gas supply pipe and the gas supply pipe 242a is referred to as a second gas supply pipe.

Furthermore, the mass flow controller 241b alone or the combination of the mass flow controller 241b and the valve 241c is referred to as a first process gas flow rate control part. Moreover, the mass flow controller 242b alone or the combination of the mass flow controller 242b and the valve 242c is referred to as a second process gas flow rate control part.

Furthermore, the mass flow controller 243c alone or the combination of the mass flow controller 243c and the valve 243d is referred to as a first inert gas flow rate control part. Moreover, the mass flow controller 244c alone or the combination of the mass flow controller 244c and the valve 244d is referred to as a second inert gas flow rate control part.

(Second Gas Supply System)

Figure 15:
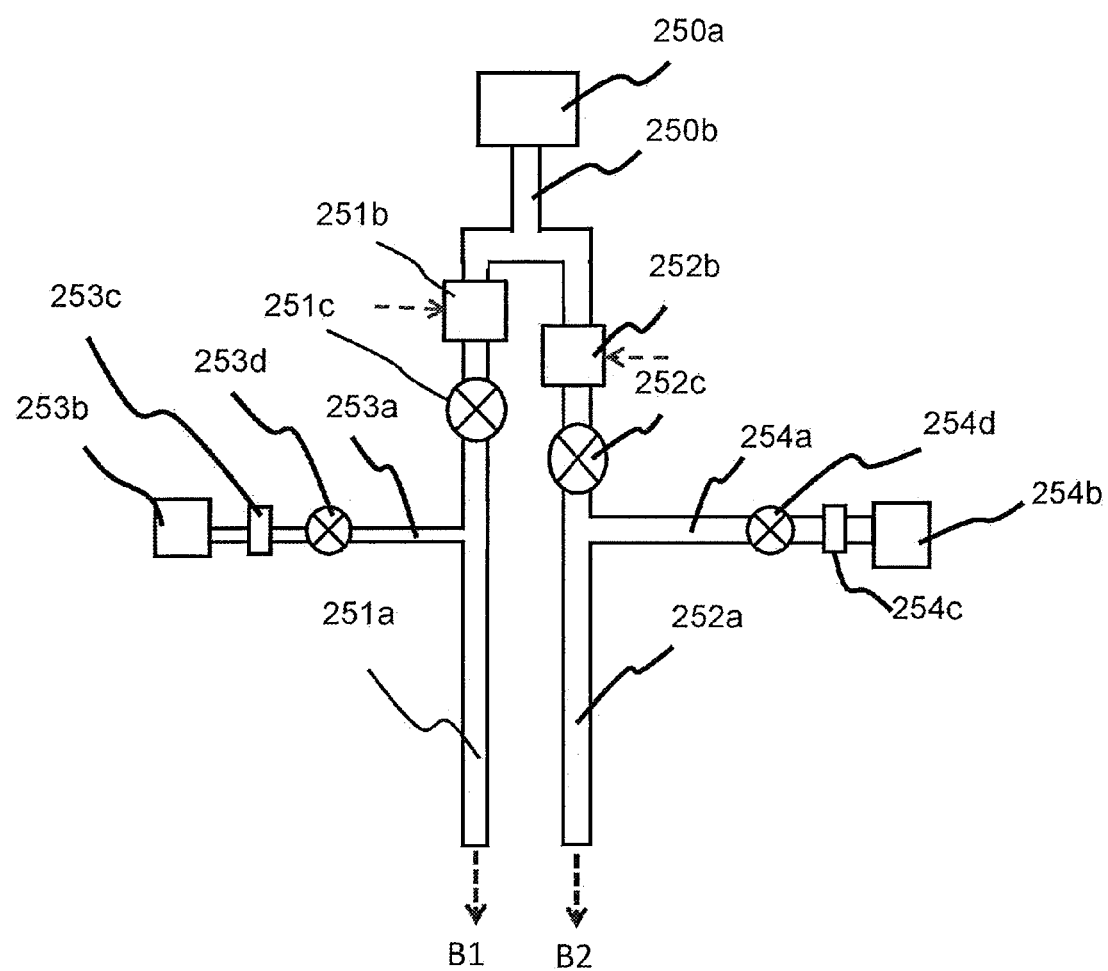
FIG. 15 is an explanatory view illustrating a gas supply system of a substrate processing apparatus according to an embodiment.

Next, a second gas supply system will be described with reference to FIG. 15. B1 indicated in FIG. 15 is connected to B1 indicated in FIG. 12. B2 indicated in FIG. 15 is connected to B2 indicated in FIG. 12. That is to say, a gas supply pipe 251a is connected to the gas introduction pipe 237. A gas supply pipe 252a is connected to the gas introduction pipe 239.

A junction pipe 250b, a mass flow controller 251b and a valve 251c are installed in the gas supply pipe 251a in the named order from the upstream side. A flow rate of a gas that passes through the gas supply pipe 251a is controlled by the mass flow controller 251b and the valve 251c. A gas source 250a of a second process gas is installed at the upstream side of the junction pipe 250b. The second process gas is an oxygen-containing gas. For example, an oxygen gas ($O_2$) is used as the second process gas.

Preferably, a third inert gas supply pipe 253a for supplying an inert gas is installed at the downstream side of the valve 251c. An inert gas source 253b, a mass flow controller 253c and a valve 253d are installed in the inert gas supply pipe 253a in the named order from the upstream side. As the inert gas, for example, a helium (He) gas is used. The inert gas is used as a dilution gas that dilutes the gas flowing through the gas supply pipe 251a. A concentration or a flow rate of the gas supplied through the gas introduction pipe 237 and the shower head 234 may be more optimally tuned by controlling the mass flow controller 253c and the valve 253d.

A junction pipe 250b, a mass flow controller 252b and a valve 252c are installed in the gas supply pipe 252a in the named order from the upstream side. A flow rate of a gas that passes through the gas supply pipe 252a is controlled by the mass flow controller 252b and the valve 252c. The gas source 250a of the second process gas is installed at the upstream side of the junction pipe 250b. The second process gas is an oxygen-containing gas. For example, an oxygen gas ($O_2$) is used as the second process gas.

Preferably, a fourth inert gas supply pipe 254a for supplying an inert gas is installed at the downstream side of the valve 252c. An inert gas source 254b, a mass flow controller 254c and a valve 254d are installed in the inert gas supply pipe 254a in the named order from the upstream side. As the inert gas, for example, a helium (He) gas is used. The inert gas is used as a dilution gas that dilutes the gas flowing through the gas supply pipe 252a. A concentration or a flow rate of the gas flowing through the gas introduction pipe 239 and the gas supply path 235 may be more optimally tuned by controlling the mass flow controller 254c and the valve 254d.

The gas supply pipe 251a, the mass flow controller 251b, the valve 251c, the gas supply pipe 252a, the mass flow controller 252b, the valve 252c and the junction pipe 250b are collectively referred to as a second gas supply system. Furthermore, the gas source 250a, the gas introduction pipe 237 and the gas introduction pipe 239 may be included in the second gas supply system.

The third inert gas supply pipe 253a, the mass flow controller 253c, the valve 253d, the fourth inert gas supply pipe 254a, the mass flow controller 254c and the valve 254d are collectively referred to as a second inert gas supply system. Furthermore, the inert gas source 253b and the inert gas source 254b may be included in the second inert gas supply system. Moreover, the second inert gas supply system may be included in the second gas supply system. In addition, the first gas supply system and the second gas supply system are collectively referred to as a gas supply system.

In the present embodiment, the gas supply pipe 251a is referred to as a third gas supply pipe and the gas supply pipe 252a is referred to as a fourth gas supply pipe.

Furthermore, the mass flow controller 251b alone or the combination of the mass flow controller 251b and the valve 251c is referred to as a third process gas flow rate control part. Moreover, the mass flow controller 252b alone or the combination of the mass flow controller 252b and the valve 252c is referred to as a fourth process gas flow rate control part.

Furthermore, the mass flow controller 253c alone or the combination of the mass flow controller 253c and the valve 253d is referred to as a third inert gas flow rate control part. Moreover, the mass flow controller 254c alone or the combination of the mass flow controller 254c and the valve 254d is referred to as a fourth inert gas flow rate control part.

As described above, the mass flow controller and the valve are installed in each of the first gas supply system and the second gas supply system. It is therefore possible to individually control the amounts of gases. Furthermore, the mass flow controller and the valve are installed in each of the first inert gas supply system and the second inert gas supply system. It is therefore possible to individually control the concentrations of gases.

(Control Part)

The substrate processing apparatus 900 includes a controller 260 that controls the operations of the respective parts of the substrate processing apparatus 900.

Figure 16:
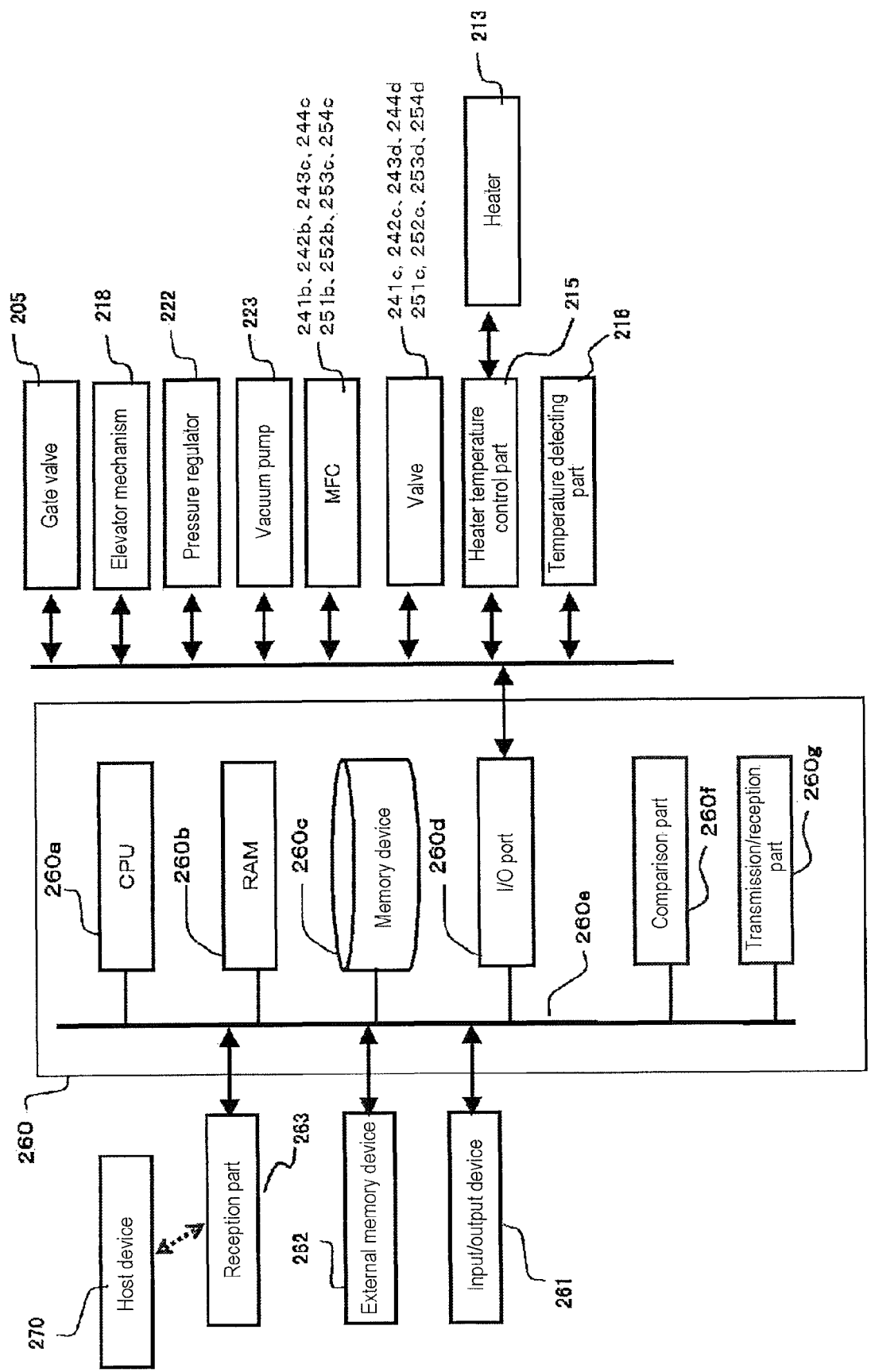
FIG. 16 is a schematic configuration view of a controller according to an embodiment.

An outline of the controller 260 is illustrated in FIG. 16. The controller 260 serving as a control part (control means) is configured as a computer including a central processing unit (CPU) 260a, a random access memory (RAM) 260b, a memory device 260c, an I/O port 260d, a comparison part 260f and a transmission/reception part 260g. The RAM 260b, the memory device 260c and the I/O port 260d are configured to exchange data with the CPU 260a via an internal bus 260e according to an instruction of the transmission/reception part 260g. An input/output device 261 configured as, e.g., a touch panel or the like, and an external memory device 262 are connectable to the controller 260. In addition, there is installed a reception part 263 electrically connected to a host device 270 via a network. The reception part 263 may receive information of other devices from the host device.

The memory device 260c is configured by, for example, a flash memory, a hard disk drive (HDD), or the like. A control program for controlling the operations of the substrate processing apparatus, a program recipe in which a sequence, condition, or the like for a substrate processing described later is written, a table to be described later, and the like are readably stored in the memory device 260c. In addition, the process recipe is a combination of sequences which causes the controller 260 to execute each sequence in a substrate processing process described later in order to obtain a predetermined result. The process recipe functions as a program. Hereinafter, the program recipe, the control program, and the like will be generally and simply referred to as a program. Furthermore, the term "program" used herein may be intended to include the program recipe alone, the control program alone, or a combination of the program recipe and the control program. Moreover, the RAM 260b is configured as a memory area (work area) in which a program, data, or the like read by the CPU 260a is temporarily held.

The I/O port 260d is connected to the gate valve 205, the elevator mechanism 218, the heater 213, the pressure regulator 222, the vacuum pump 223 and the like. In addition, the I/O port 260d may be connected to the MFCs 241b, 242b, 243c, 244c, 251b, 252b, 253c and 254c, the valves 241c, 242c, 243d, 244d, 251c, 252c, 253d and 254d, and the like.

The CPU 260a is configured to read the control program from the memory device 260c and to execute the control program. Furthermore, the CPU 260a is configured to read the process recipe from the memory device 260c according to an operation command inputted from the input/output device 261, or the like. In addition, the CPU 260a is configured to control the opening/closing operation of the gate valve 205, the elevating operation of the elevator mechanism 218, the operation of supplying electric power to the heater 213, the pressure regulating operation performed by the pressure regulator 222, the on/off control of the vacuum pump 223, the flow rate adjusting operations of the mass flow controllers, the operations of the valves, and the like, according to the contents of the read process recipe.

In addition, the controller 260 is not limited to being configured as a dedicated computer and may be configured as a general-purpose computer. For example, the controller 260 according to the present embodiment may be configured by preparing the external memory device 262 (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory or a memory card) which stores the program described above, and installing the program on the general-purpose computer using the external memory device 262. Furthermore, a means for supplying the program to the computer is not limited to the case of supplying the program through the external memory device 262. For example, the program may be supplied using a communication means such as the Internet or a dedicated line without going through the external memory device 262. Moreover, the memory device 260c or the external memory device 262 is configured as a non-transitory computer-readable recording medium. Hereinafter, these will be generally and simply referred to as a recording medium. Additionally, the term "recording medium" used herein may be intended to include the memory device 260c alone, the external memory device 262 alone, or both the memory device 260c and the external memory device 262.

Subsequently, descriptions will be made on a table. The memory device 260c includes a table illustrated in FIG. 26. The table illustrates a relationship between first insulating film distributions and control values α11 to α14 and β12 to β14 of the respective mass flow controllers. When the reception part 263 receives first insulating film distribution information, the CPU 260a reads the table from the memory part 260b. The comparison part 260f compares the read table and the received information. Data α11, α12, α13 and α14 calculated as a result of comparison are transmitted, as control values, to the respective mass flow controllers.

Next, a method of forming a film using the substrate processing apparatus 900 will be described. After the film thickness measuring step S103, the measured wafer 200 is loaded into the substrate processing apparatus 900. In the following descriptions, the operations of respective parts that constitute the substrate processing apparatus 900 are controlled by the controller 260.

(Substrate Loading Step)

After the thickness of the first insulating film 200S is measured at the film thickness measuring step S103, the wafer 200 is loaded into the substrate processing apparatus 900. Specifically, the substrate support part 210 is moved down by the elevator mechanism 218 such that the lift pins 207 protrude from the through-holes 214 toward the upper surface side of the substrate support part 210. Furthermore, after the internal pressure of the process chamber 201 is regulated to a predetermined pressure, the gate valve 205 is opened and the wafer 200 is mounted onto the lift pins 207 from the gate valve 205. After the wafer 200 is mounted onto the lift pins 207, the substrate support part 210 is moved up to a predetermined position by the elevator mechanism 218 so that the wafer 200 is transferred from the lift pins 207 to the substrate support part 210.

(Pressure Reducing and Temperature Increasing Step)

Thereafter, the interior of the process chamber 201 is evacuated through the exhaust pipe 224 such that the internal pressure of the process chamber 201 reaches a predetermined pressure (vacuum degree). At this time, the opening degree of the APC valve as the pressure regulator 222 is feedback-controlled based on the pressure value measured by a pressure sensor. Furthermore, the amount of electric current supplied to the heater 213 is feedback-controlled based on the temperature value detected by the temperature detecting part 216, such that the internal temperature of the process chamber 201 reaches a predetermined temperature. Specifically, the substrate support part 210 is preheated by the heater 213. After a temperature change in the wafer 200 or the substrate support part 210 disappears, the wafer 200 and the substrate support part 210 are left alone for a predetermined period of time. During this period, when moisture remains in the process chamber 201 or degassing occurs from a member, it may be removed by vacuum-exhausting or purging through the supply of an inert gas. By doing so, a preparation preceding a film forming process is completed. When evacuating the interior of the process chamber 201 to a predetermined pressure, the interior of the process chamber 201 may be first evacuated up to a reachable vacuum degree.

After the wafer 200 is mounted on the substrate support part 210 and the atmosphere within the process chamber 201 is stabilized, the mass flow controller 241b, the mass flow controller 242b, the mass flow controller 251b and the mass flow controller 252b are actuated and the opening degrees of the valve 241c, the valve 242c, the valve 251c and the valve 252c are also adjusted. At this time, the mass flow controller 243c, the mass flow controller 244c, the mass flow controller 253c and the mass flow controller 254c may be actuated and the opening degrees of the valve 243d, the valve 244d, the valve 253d and the valve 254d may be adjusted.

(Gas Supply Step)

At a gas supply step, gases are supplied into the process chamber 201 from the first gas supply system and the second gas supply system.

When supplying the gases, an amount (or a concentration) of a process gas supplied to the central surface of the wafer 200 and an amount (or a concentration) of a process gas supplied to the peripheral surface of the wafer 200 are respectively controlled by controlling the mass flow controllers and the valves of the first gas supply system and the second gas supply system according to the film thickness distribution data of the insulating film 2005 received from the host device 270. More preferably, the in-plane temperature gradient of the wafer 200 is controlled by controlling the central zone heater 213a and the outer zone heater 213b according to the measurement data received from the host device 270.

The gases supplied into the process chamber 201 are decomposed within the process chamber 201 to form the second insulating film 2007 on the first insulating film 2005 which has been subjected to the polishing.

After a predetermined period of time is elapsed, the respective valves are closed to stop the supply of gases.

At this time, the temperature of the heater 213 is set at a temperature which does not adversely affect the already-formed configurations such as the gate electrodes 2003 and the like. For example, the temperature of the heater 213 is set such that the temperature of the wafer 200 falls within a range of 200 to 500 degrees C., specifically 300 to 450 degrees C. As the inert gas, in addition to the He gas, any gas may be used as long as it does not adversely affect the film. For example, a rare gas such as Ar, $N_2$, Ne, Xe or the like may be used.

(Substrate Unloading Step)

After the film forming step is finished, the substrate support part 210 is moved down by the elevator mechanism 218 such that the lift pins 207 protrude from the through-holes 214 to the upper surface side of the substrate support part 210. Furthermore, after the internal pressure of the process chamber 201 is regulated to a predetermined pressure, the gate valve 205 is opened and the wafer 200 is transferred from above the lift pins 207 to the outside of the gate valve 205.

Subsequently, a method of controlling the thickness of the second interlayer insulating film using this apparatus will be described. As described above, after the polishing step S102 is completed, the first poly-Si film 2005 has different film thicknesses in the central surface and the peripheral surface of the wafer 200. At the measuring step S103, the film thickness distribution is measured. The measurement result is stored in the RAM 260b through the host device 270. The stored data are compared with a table stored in the memory device 260c and the apparatus is controlled based on the corresponding control value.

Subsequently, a case where the data received from the host device and stored in the RAM 260b have distribution A will be described. The case of distribution A refers to a case where the insulating film 2005a is thicker than the insulating film 2005b as illustrated in FIG. 7.

In the case of distribution A, at this step, control is executed so that the insulating film 2007b formed on the peripheral surface of the wafer 200 becomes thick and so that the thickness of the insulating film 2007a formed on the central surface of the wafer 200 becomes smaller than the thickness of the insulating film 2007b. Specifically, when supplying the gas, control is executed so that the silicon-containing gas supplied to the peripheral surface of the wafer 200 becomes larger in amount than the silicon-containing gas supplied to the central surface of the wafer 200. By doing so, the height of the insulating film in the semiconductor device, namely the thickness of the laminated insulating film obtained by overlapping the insulating film 2007 with the insulating film 2005, can be corrected like target film thickness distribution A' illustrated in FIG. 9. That is to say, the thickness of the laminated insulating film can be corrected like film thickness distribution A'.

Specifically, a table illustrated in FIG. 26 is first read from the memory device 260c. The comparison part 260f compares the read data with the received film thickness distribution, thereby selecting the control values of the respective mass flow controllers. In this regard, a control value α101 is selected with respect to the mass flow controller 241b. A control value α102 is selected with respect to the mass flow controller 242b. A control value α103 is selected with respect to the mass flow controller 251b. A control value α104 is selected with respect to the mass flow controller 252b. Thereafter, the transmission/reception part 260g transmits the control values to the respective mass flow controllers via the I/O port 260d. The respective mass flow controllers are adjusted at the received control values so as to control the flow rates of gases.

In the first gas supply system, the mass flow controller 241b is controlled based on the received control value so as to control the amount of the silicon-containing gas supplied from the shower head 234 into the process chamber 201. Furthermore, the mass flow controller 242b is controlled so as to supply the silicon-containing gas from the gas supply path 235 into the process chamber 201. An exposure amount of the silicon-containing gas per unit area in a processing plane of the wafer 200 is controlled such that an exposure amount of the gas supplied from the gas supply path 235 becomes larger than an exposure amount of the gas supplied from the shower head. The term "exposure amount" used herein refers to an exposure amount of a main component of a process gas. In the present embodiment, the process gas is a silicon-containing gas and the main component is silicon.

Furthermore, in the second gas supply system, the mass flow controller 251b is controlled based on the received control value and the opening degree of the valve 251c is controlled to control the amount of the oxygen-containing gas supplied from the shower head 234. The amount of the oxygen-containing gas in the gas supply pipe 251a is set at an amount corresponding to the amount of the silicon-containing gas in the gas supply pipe 241a. Moreover, the mass flow controller 252b is controlled and the opening degree of the valve 252c is controlled to supply the oxygen-containing gas from the gas supply path 235. The amount of the oxygen-containing gas in the gas supply pipe 252a is set at an amount corresponding to the amount of the silicon-containing gas in the gas supply pipe 242a.

At this time, an exposure amount of the silicon-containing gas per unit area in a processing plane of the wafer 200 is controlled such that an exposure amount of the gas supplied from the gas supply path 235 becomes larger than an exposure amount of the gas supplied from the shower head 234. The term "exposure amount" used herein refers to an exposure amount of a main component of a process gas. In the present embodiment, the process gas is a silicon-containing gas and the main component is silicon.

The silicon-containing gas and the oxygen-containing gas supplied through the shower head 234 are supplied onto the insulating film 2005a formed on the central surface of the wafer 200. The gases thus supplied form the insulating film 2007a on the insulating film 2005a as illustrated in FIGS. 8A and 8B.

The silicon-containing gas and the oxygen-containing gas supplied through the gas supply path 235 are supplied onto the insulating film 2005b formed on the peripheral surface of the wafer 200. The gases thus supplied form the insulating film 2007b on the insulating film 2005b as illustrated in FIGS. 8A and 8B.

As described above, the exposure amount of the silicon-containing gas per unit area in the processing plane of the wafer 200 is larger on the insulating film 2005b than on the insulating film 2005a. It is therefore possible to make the thickness of the insulating film 2007b larger than the thickness of the insulating film 2007a.

At this time, the thickness of the insulating film 2007 is controlled such that as illustrated in FIGS. 8A and 8B, a thickness H1b of the insulating film 2005b and the insulating film 2007b overlapped with each other becomes substantially equal to a thickness H1a of the insulating film 2005a and the insulating film 2007a overlapped with each other. More preferably, the thickness of the insulating film 2007 is controlled such that a difference between the distance from the substrate surface 200a to the upper end of the insulating film 2007b and the distance from the substrate surface 200a to the upper end of the insulating film 2007a falls within a predetermined range. Even more preferably, the film thickness distribution of the second insulating film 2007 is controlled such that the distribution of the heights of the insulating film 2007 (the upper end of the second interlayer insulating film) in the plane of the substrate falls within a predetermined range.

As an alternative method, the supply amounts of the silicon-containing gas supplied through the gas supply pipe 241a and the gas supply pipe 242a may be made equal to each other and, instead, the concentrations of the silicon-containing gas supplied through the gas supply pipe 241a and the gas supply pipe 242a may be controlled. When controlling the concentrations of the silicon-containing gas, the concentrations of the silicon-containing gas passing through the gas supply pipe 241a and the gas supply pipe 242a are controlled by controlling the first inert gas supply system. In the case of distribution A, the concentration of the silicon-containing gas passing through the gas supply pipe 241a is reduced and the concentration of the silicon-containing gas passing through the gas supply pipe 242a is made higher than the concentration of the silicon-containing gas passing through the gas supply pipe 241a.

Specifically, upon receiving film thickness distribution A, a table illustrated in FIG. 27 is read in place of the table illustrated in FIG. 26. The comparison part 260f compares the read table illustrated in FIG. 27 with the received film thickness distribution, thereby selecting control values α201 to α208 of the mass flow controller 241b, the mass flow controller 243c, the mass flow controller 242b, the mass flow controller 244c, the mass flow controller 251c, the mass flow controller 253c, the mass flow controller 252b and the mass flow controller 254c. Thereafter, the transmission/reception part 260g transmits the control values to the respective mass flow controllers via the I/O port 260d. The respective mass flow controllers are adjusted at the received control values so as to control the flow rates of gases.

By doing so, it is possible to more accurately control the exposure amount of the silicon-containing gas per unit area in the processing plane of the wafer 200 such that the gas amount supplied from the gas supply path 235 becomes larger than the gas amount supplied from the shower head 234. By virtue of this control, the thickness of the insulating film 2007b can be reliably made larger than the thickness of the insulating film 2007a.

More preferably, the supply amounts of the silicon-containing gas supplied through the gas supply pipe 241a and the gas supply pipe 242a may be made different and the concentrations thereof may be made different. By virtue of this control, it is possible to supply the silicon-containing gas at a greater difference in the exposure amount of the silicon-containing gas per unit area. That is to say, it is possible to increase the film thickness difference between the insulating film 2007a and the insulating film 2007b. Accordingly, even if the height difference between the insulating film 2005a and the insulating film 2005b becomes larger at the insulating film polishing step S102, it is possible to align the heights.

Even more preferably, the central zone heater 213a and the outer zone heater 213b may be controlled in parallel with the aforementioned control of the process gas. In this case, a table illustrated in FIG. 28 is read in place of the tables illustrated in FIGS. 26 and 27. The comparison part 260f compares the read table illustrated in FIG. 28 with the received film thickness distribution, thereby selecting control values α301 to α304 of the mass flow controller 241b, the mass flow controller 243c, the mass flow controller 242b, the mass flow controller 244c, the mass flow controller 251c, the mass flow controller 253c, the mass flow controller 252b and the mass flow controller 254c and control values α305 and α306 of the heater 213a and the heater 213b. Thereafter, the transmission/reception part 260g transmits the control values to the respective mass flow controllers via the I/O port 260d. The respective mass flow controllers are adjusted at the received control values so as to control the flow rates of gases. Moreover, the transmission/reception part 260g transmits the control values to the heater temperature control part 215 via the I/O port 260d; accordingly, the heater temperature control part 215 performs a control operation so that the wafer 200 has a desired temperature distribution.

In the case of simultaneously controlling the inert gas supply system, a table illustrated in FIG. 29 is read in place of the table illustrated in FIG. 28. The comparison part 260f compares the read table illustrated in FIG. 29 with the received film thickness distribution, thereby selecting control values α401 to α408 of the mass flow controller 241b, the mass flow controller 243c, the mass flow controller 242b, the mass flow controller 244c, the mass flow controller 251c, the mass flow controller 253c, the mass flow controller 252b and the mass flow controller 254c and control values α409 and α410 of the heater 213a and the heater 213b. Thereafter, the transmission/reception part 260g transmits the control values to the respective mass flow controllers and heaters via the I/O port 260d. The respective mass flow controllers are adjusted at the received control values so as to control the flow rates of gases. Moreover, the transmission/reception part 260g transmits the control values to the heater temperature control part 215 via the I/O port 260d; accordingly, the heater temperature control part 215 performs a control operation so that the wafer 200 has a desired temperature distribution.

The thickness of the film thus formed is proportional to the temperature. Therefore, in the case of distribution A, the temperature of the outer zone heater 213b is set higher than the temperature of the central zone heater 213a. This is effective in a case where the insulating film 2007 is formed using a gas, e.g., a disilane gas, the temperature condition of which greatly contributes to the film formation efficiency.

If the supply amount (concentration) of the process gas and the temperature are parallel-controlled in this way, it is possible to accurately control the film thickness.

Subsequently, a case where the data stored in the RAM 260b have distribution B will be described. The case of distribution B refers to a case where the insulating film 2005b is thicker than the insulating film 2005a as illustrated in FIG. 7.

In the case of distribution B, at this step, control is executed so that the insulating film 2007a formed on the central surface of the wafer 200 becomes thick and so that the thickness of the insulating film 2007b formed on the peripheral surface of the wafer 200 becomes smaller than the thickness of the insulating film 2007a. Specifically, when supplying the gas, control is executed so that the silicon-containing gas supplied to the central surface of the wafer 200 becomes larger in amount than the silicon-containing gas supplied to the peripheral surface of the wafer 200. By doing so, the height of the insulating film in the semiconductor device, namely the thickness of the insulating film 2005 and the insulating film 2007 overlapped with each other, can be corrected like target film thickness distribution B' illustrated in FIG. 11. That is to say, the thickness of the laminated insulating film can be corrected like film thickness distribution B'.

Specifically, a table illustrated in FIG. 26 is first read from the memory device 260c. The comparison part 260f compares the read data with the received film thickness distribution, thereby selecting the control values of the respective mass flow controllers. In this regard, a control value β101 is selected with respect to the mass flow controller 241b. A control value β 102 is selected with respect to the mass flow controller 242b. A control value β103 is selected with respect to the mass flow controller 251b. A control value β104 is selected with respect to the mass flow controller 252b. Thereafter, the transmission/reception part 260g transmits the control values to the respective mass flow controllers via the I/O port 260d. The respective mass flow controllers are adjusted at the received control values so as to control the flow rates of gases.

In the first gas supply system, the mass flow controller 241b is controlled based on the received control value and the opening degree of the valve 241c is controlled so as to control the amount of the silicon-containing gas supplied from the shower head 234 into the process chamber 201. Furthermore, the mass flow controller 242b is controlled and the opening degree of the valve 242c is controlled so as to supply the silicon-containing gas from the gas supply path 235 into the process chamber 201. An exposure amount of the silicon-containing gas per unit area in the processing plane of the wafer 200 is controlled such that an exposure amount of the gas supplied from the shower head 234 becomes larger than an exposure amount of the gas supplied from the gas supply path 235.

Furthermore, in the second gas supply system, the mass flow controller 251b is controlled based on the received control value and the opening degree of the valve 251c is controlled to control the amount of the oxygen-containing gas supplied from the shower head 234. The amount of the oxygen-containing gas in the gas supply pipe 251a is set at an amount corresponding to the amount of the silicon-containing gas in the gas supply pipe 241a. Moreover, the mass flow controller 252b is controlled and the opening degree of the valve 252c is controlled to supply the oxygen-containing gas from the gas supply path 235. The amount of the oxygen-containing gas in the gas supply pipe 252a is set at an amount corresponding to the amount of the silicon-containing gas in the gas supply pipe 242a.

At this time, an exposure amount of the silicon-containing gas per unit area in the processing plane of the wafer 200 is controlled such that an exposure amount of the gas supplied from the shower head 234 becomes larger than an exposure amount of the gas supplied from the gas supply path 235.

The silicon-containing gas and the oxygen-containing gas supplied through the shower head 234 are supplied onto the insulating film 2005a formed on the central surface of the wafer 200. The gases thus supplied form the insulating film 2007a on the insulating film 2005a as illustrated in FIGS. 10A and 10B.

The silicon-containing gas and the oxygen-containing gas supplied through the gas supply path 235 are supplied onto the insulating film 2005b formed on the peripheral surface of the wafer 200. The gases thus supplied form the insulating film 2007b on the insulating film 2005b as illustrated in FIGS. 10A and 10B.

As described above, the exposure amount of the silicon-containing gas per unit area in the processing plane of the wafer 200 is larger on the insulating film 2005a than on the insulating film 2005b. It is therefore possible to make the thickness of the insulating film 2007a larger than the thickness of the insulating film 2007b.

At this time, the thickness of the insulating film 2007 is controlled such that as illustrated in FIGS. 10A and 10B, a thickness H1b of the insulating film 2005b and the insulating film 2007b overlapped with each other becomes substantially equal to a thickness H1a of the insulating film 2005a and the insulating film 2007a overlapped with each other. More preferably, the thickness of the insulating film 2007 is controlled such that a difference between the distance from the substrate surface 200a to the upper end of the insulating film 2007b and the distance from the substrate surface 200a to the upper end of the insulating film 2007a falls within a predetermined range. Even more preferably, the film thickness distribution of the second insulating film 2007 is controlled such that the distribution of the heights of the insulating film 2007 (the upper end of the second interlayer insulating film) in the plane of the substrate falls within a predetermined range.

As an alternative method, the supply amounts of the silicon-containing gas supplied through the gas supply pipe 241a and the gas supply pipe 242a may be made equal to each other and, instead, the concentrations of the silicon-containing gas supplied through the gas supply pipe 241a and the gas supply pipe 242a may be controlled. When controlling the concentrations of the silicon-containing gas, the concentrations of the silicon-containing gas passing through the gas supply pipe 241a and the gas supply pipe 242a are controlled by controlling the first inert gas supply system. In the case of distribution B, the concentration of the silicon-containing gas passing through the gas supply pipe 242a is reduced and the concentration of the silicon-containing gas passing through the gas supply pipe 241a is made higher than the concentration of the silicon-containing gas passing through the gas supply pipe 242a.

Specifically, upon receiving film thickness distribution B, a table illustrated in FIG. 27 is read in place of the table illustrated in FIG. 26. The comparison part 260f compares the read table illustrated in FIG. 27 with the received film thickness distribution, thereby selecting control values β201 to β208 of the mass flow controller 241b, the mass flow controller 243c, the mass flow controller 242b, the mass flow controller 244c, the mass flow controller 251c, the mass flow controller 253c, the mass flow controller 252b and the mass flow controller 254c. Thereafter, the transmission/reception part 260g transmits the control values to the respective mass flow controllers via the I/O port 260d. The respective mass flow controllers are adjusted at the received control values so as to control the flow rates of gases.

By doing so, it is possible to more reliably control the exposure amount of the silicon-containing gas per unit area in the processing plane of the wafer 200 such that the gas amount supplied from the shower head 234 becomes larger than the gas amount supplied from the gas supply path 235. By virtue of this control, the thickness of the insulating film 2007a can be reliably made larger than the thickness of the insulating film 2007b.

More preferably, the supply amounts of the silicon-containing gas supplied through the gas supply pipe 251a and the gas supply pipe 252a may be made different and the concentrations thereof may be made different. By virtue of this control, it is possible to supply the silicon-containing gas at a greater difference in the exposure amount of the silicon-containing gas per unit area. That is to say, it is possible to increase the film thickness difference between the insulating film 2007a and the insulating film 2007b. Accordingly, even if the height difference between the insulating film 2005a and the insulating film 2005b becomes larger at the insulating film polishing step S102, it is possible to align the heights.

Even more preferably, the central zone heater 213a and the outer zone heater 213b may be controlled in parallel with the aforementioned control of the process gas. In this case, a table illustrated in FIG. 28 is read in place of the tables illustrated in FIGS. 26 and 27. The comparison part 260f compares the read table illustrated in FIG. 28 with the received film thickness distribution, thereby selecting control values β301 to β304 of the mass flow controller 241b, the mass flow controller 243c, the mass flow controller 242b, the mass flow controller 244c, the mass flow controller 251c, the mass flow controller 253c, the mass flow controller 252b and the mass flow controller 254c and control values β305 and β306 of the heater 213a and the heater 213b. Thereafter, the transmission/reception part 260g transmits the control values to the respective mass flow controllers via the I/O port 260d. The respective mass flow controllers are adjusted at the received control values so as to control the flow rates of gases. Moreover, the transmission/reception part 260g transmits the control values to the heater temperature control part 215 via the I/O port 260d; accordingly, the heater temperature control part 215 performs a control operation so that the wafer 200 has a desired temperature distribution.

In the case of simultaneously controlling the inert gas supply system, a table illustrated in FIG. 29 is read in place of the table illustrated in FIG. 28. The comparison part 260f compares the read table illustrated in FIG. 29 with the received film thickness distribution, thereby selecting control values β401 to β408 of the mass flow controller 241b, the mass flow controller 243c, the mass flow controller 242b, the mass flow controller 244c, the mass flow controller 251c, the mass flow controller 253c, the mass flow controller 252b and the mass flow controller 254c and control values β409 and β410 of the heater 213a and the heater 213b. Thereafter, the transmission/reception part 260g transmits the control values to the respective mass flow controllers via the I/O port 260d. The respective mass flow controllers are adjusted at the received control values so as to control the flow rates of gases. Moreover, the transmission/reception part 260g transmits the control values to the heater temperature control part 215 via the I/O port 260d; accordingly, the heater temperature control part 215 performs a control operation so that the wafer 200 has a desired temperature distribution.

The thickness of the film thus formed is proportional to the temperature. Therefore, in the case of distribution B, the temperature of the central zone heater 213a is set higher than the temperature of the outer zone heater 213b. This is effective in a case where the insulating film 2007 is formed using a gas, e.g., a disilane gas, the temperature condition of which greatly contributes to the film formation efficiency.

If the supply amount (concentration) of the process gas and the temperature are parallel-controlled in this way, it is possible to accurately control the film thickness.

As described above, by tuning the amount of the silicon-containing gas per unit area in the processing plane of the wafer 200, it is possible to control the thickness of the second insulating film 2007 at the center of the wafer 200 and the periphery thereof.

At this time, the thickness of the insulating film 2007 is controlled such that the thickness of the insulating film 2005b and the insulating film 2007b overlapped with each other becomes equal to the thickness of the insulating film 2005a and the insulating film 2007a overlapped with each other.

(Film Thickness Measuring Step S105)

Subsequently, a film thickness measuring step S105 will be described. At the film thickness measuring step S105, the height of an overlapped layer of the first insulating film 2005 and the second insulating film 2007 is measured. Specifically, it is checked whether the heights of the overlapped layer are aligned with each other, namely whether the thickness of the laminated insulating film is corrected like a target film thickness distribution. The expression "heights are aligned" used herein is not limited to a case where heights are completely identical with one another but may refer to a case where a height difference exists. For example, the height difference may fall within a range that does not affect a patterning step or a metal film forming step which will be described later.

After the second insulating film forming step S104, the wafer 200 is loaded into the measuring apparatus. The measuring apparatus measures a film thickness (height) distribution of the insulating film 2007 by measuring film thicknesses of at least some points of the central surface and the peripheral surface of the wafer 200 that may be easily affected by the polishing apparatus 400. The measurement data are transmitted to the host device. After the measurement, the wafer 200 is unloaded from the measuring apparatus. If the height distribution in the plane of the wafer 200 falls within a predetermined range, specifically a range that does not affect a patterning step or a metal film forming step which will be described later, the flow proceeds to a nitride film forming step S106. In the case where it is previously known that the film thickness distribution is a predetermined distribution, the film thickness measuring step S105 may be omitted.

(Nitride Film Forming Step S106)

Next, a nitride film foaming step 106 will be described. After the film thickness is measured, the wafer 200 is loaded into a nitride film forming apparatus. The nitride film forming apparatus is a typical single-substrate-type apparatus. Thus, descriptions thereof will be omitted.

Figure 17A:
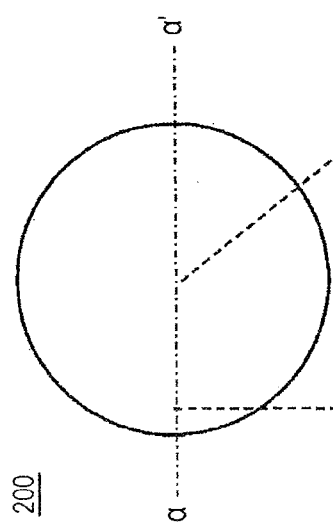
FIGS. 17A and 17B are explanatory views illustrating a processing state of a wafer according to an embodiment.
Figure 17B:
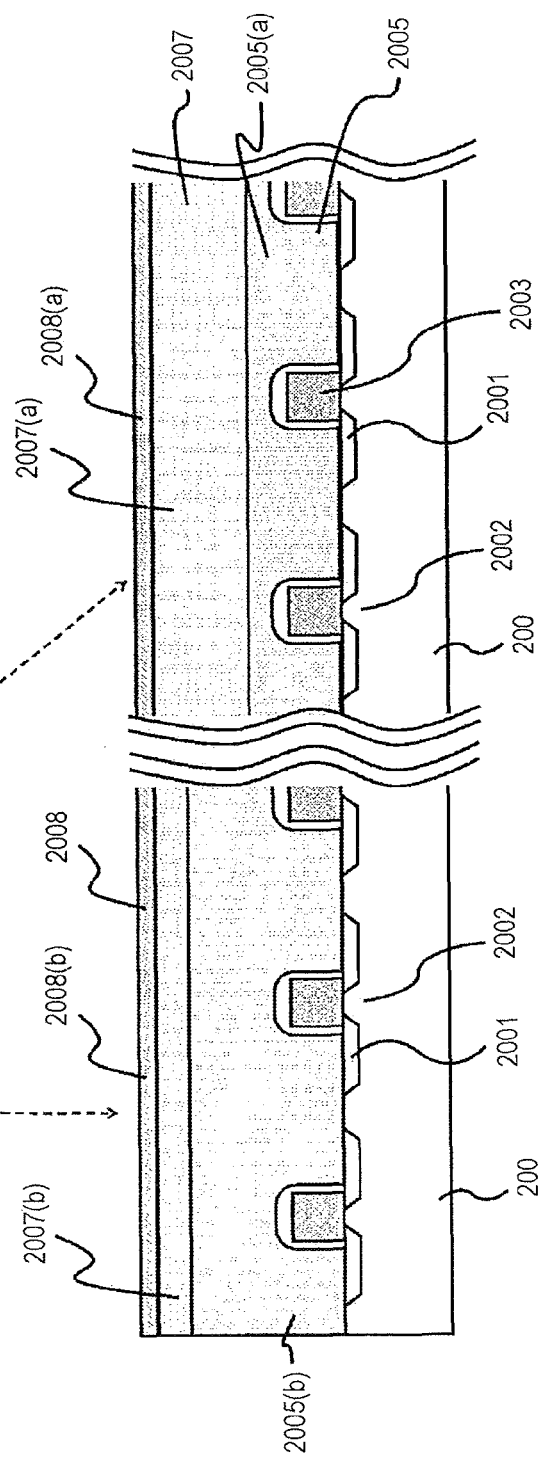

At this step, as illustrated in FIGS. 17A and 17B, a silicon nitride film 2008 is foamed on the second insulating film 2007. The silicon nitride film serves as a hard mask during an etching process of a patterning step which will be described later. In FIGS. 17A and 17B, distribution A is illustrated as an example. However, the present disclosure is not limited thereto. It goes without saying that the present disclosure is equally applicable to distribution B.

In the nitride film forming apparatus, a silicon-containing gas and a nitrogen-containing gas are supplied into the process chamber to form the silicon nitride film 2008 on the wafer 200. The silicon-containing gas is, for example, a disilane ($Si_2H_4$) gas. The nitrogen-containing gas is, for example, an ammonia ($NH_3$) gas.

Since the silicon nitride film 2008 is formed on the insulating film 2007 whose heights are aligned at the second insulating film forming step S104, the heights of the silicon nitride film 2008 also have a height distribution falling within a predetermined range in the substrate plane. That is to say, in the plane of the wafer 200, the distance from the wafer surface 200a to the surface of the silicon nitride film 2008 falls within a predetermined range in the plane of the wafer 200.

(Film Thickness Measuring Step S107)

Subsequently, a film thickness measuring step S107 will be described. At the film thickness measuring step S107, the height of the overlapping layer of the first insulating film, the second insulating film and the silicon nitride film is measured. The expression "heights are aligned" used herein is not limited to a case where heights are completely identical with one another but may refer to a case where a height difference exists. For example, the height difference may fall within a range that does not affect an etching step or a metal film forming step which will be described later.

After the nitride film forming step S106, the wafer 200 is loaded into the measuring apparatus. The measuring apparatus measures a film thickness (height) distribution of the silicon nitride film 2008 by measuring film thicknesses of at least some points of the central surface and the peripheral surface of the wafer 200 that may be easily affected by the polishing apparatus 400. The measurement data are transmitted to the host device. After the measurement, the wafer 200 is unloaded from the measuring apparatus. If the height distribution in the plane of the wafer 200 falls within a predetermined range, specifically a range that does not affect a patterning step or a metal film forming step which will be described later, the flow proceeds to a patterning step S108.

(Patterning Step S108)

Figure 18A:
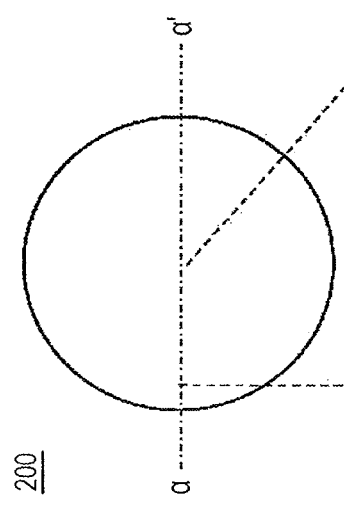
FIGS. 18A and 18B are explanatory views illustrating a processing state of a wafer according to an embodiment.
Figure 18B:
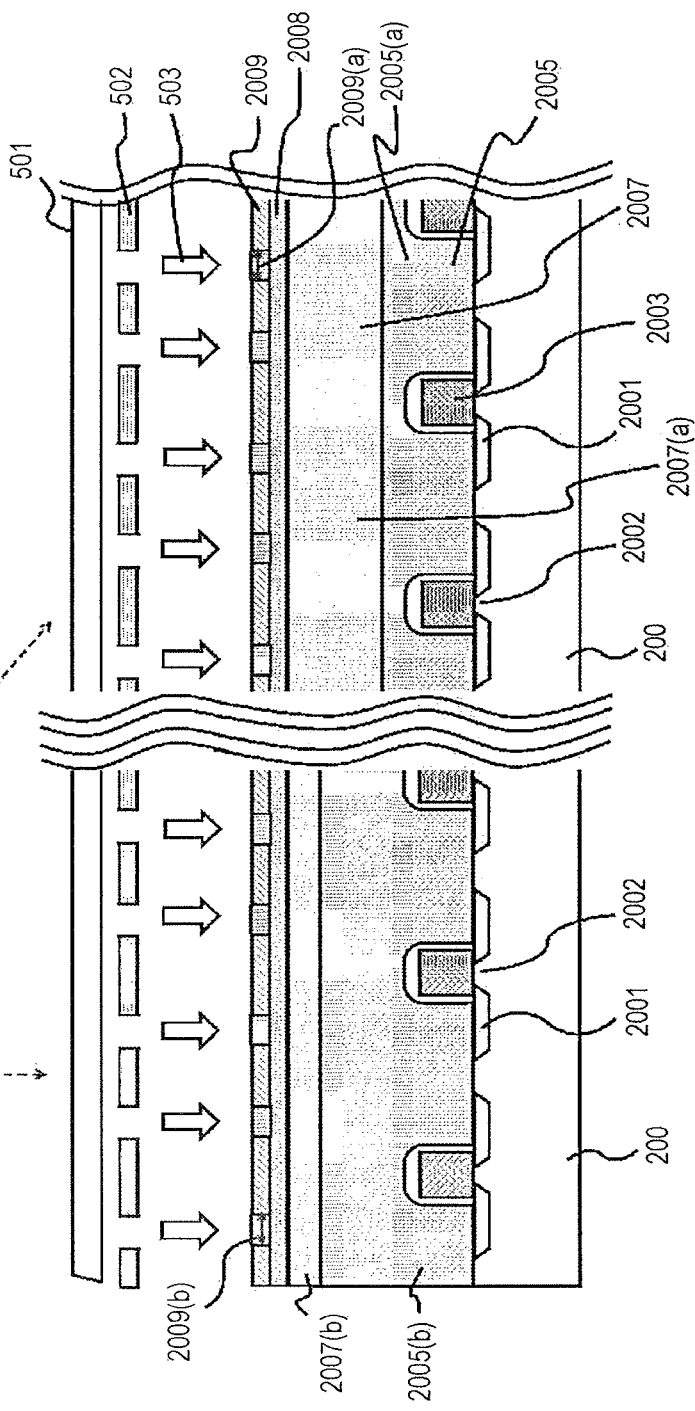
Figure 19A:
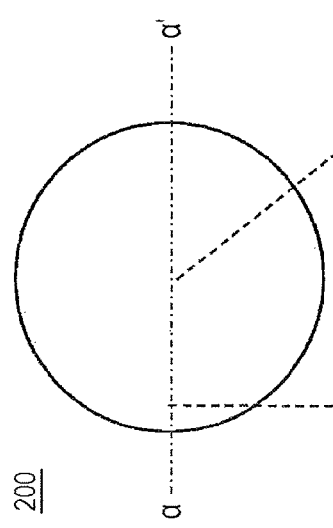
FIGS. 19A and 19B are explanatory views illustrating a processing state of a wafer according to an embodiment.
Figure 19B:
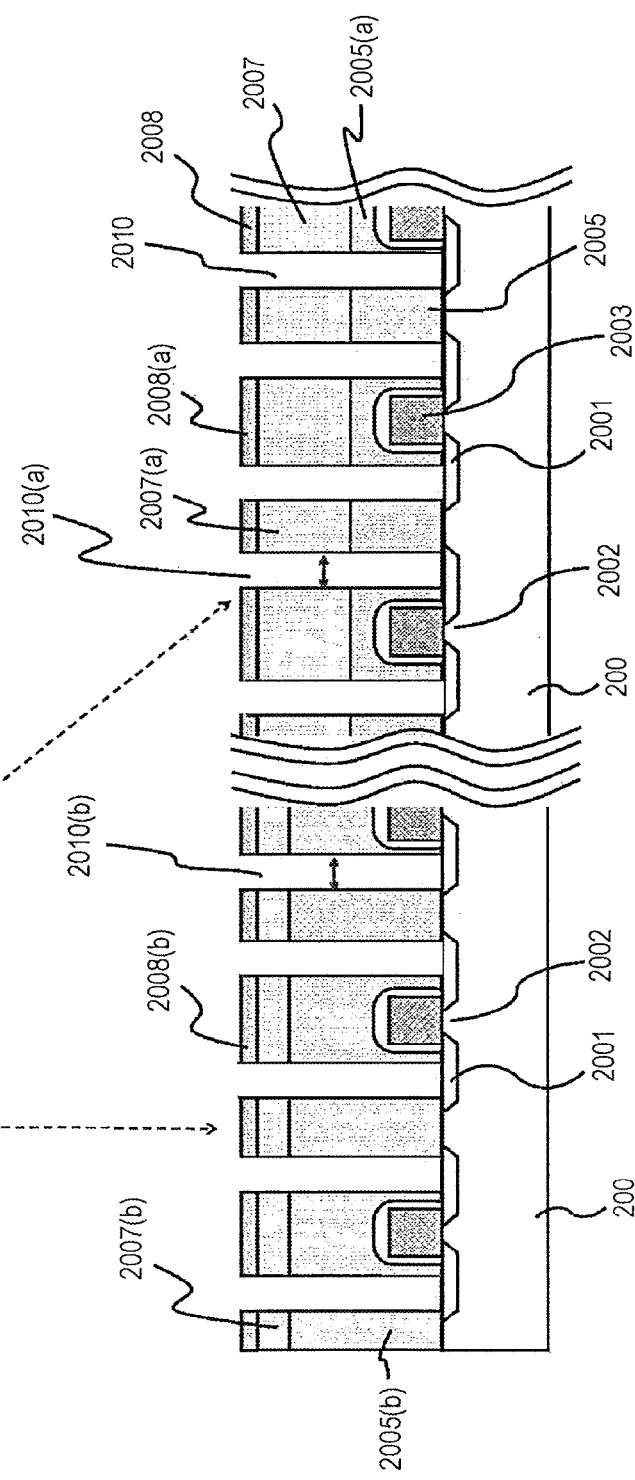

Subsequently, a patterning step S108 will be described. FIGS. 18A and 18B are views illustrating a state of the wafer 200 during an exposure process. FIGS. 19A and 19B are views illustrating a state of the wafer 200 after an etching process.

Hereinafter, details of the patterning step S108 will be described. After the silicon nitride film is foamed, a resist film 2009 is coated on the silicon nitride film in a resist forming apparatus. Thereafter, as illustrated in FIGS. 18A and 18B, an exposure process is performed by emitting light from a lamp 501 in an exposure apparatus. In the exposure apparatus, light 503 is irradiated onto the resist film 2009 through a mask 502 to reform a portion of the resist film 2009. In this regard, the reformed resist film existing on the central surface of the wafer 200 will be referred to as a resist film 2009a and the reformed resist film existing on the peripheral surface of the wafer 200 will be referred to as a resist film 2009b.

As described above, the height distribution from the wafer surface 200a to the surface of the silicon nitride film 2008 falls within a predetermined range in the substrate plane. Thus, the heights from the wafer surface 200a to the surface of the resist film 2009 can be aligned. During the exposure process, the distance from the lamp 501 to the resist film 2009, namely the moving distance of the light 503, is made uniform in the plane of the wafer 200. It is therefore possible to make uniform the in-plane distribution of a depth of focus.

Since the depth of focus can be made uniform, it is possible to make uniform the width of the resist film 2009a and the resist film 2009b in the substrate plane. This makes it possible to eliminate a variation in the pattern width.

Subsequently, a state of the wafer 200 after the etching process will be described with reference to FIGS. 19A and 19B. As described above, the width of the resist film 2009a and the resist film 2009b is uniform. It is therefore possible to make uniform an etching width in the plane of the wafer 200. Thus, an etching gas can be uniformly supplied to the central surface and the peripheral surface of the wafer 200. It is therefore possible to make uniform the widths of etched grooves 2010, namely the width of a groove 2010a existing on the central surface of the wafer 200 and the width of a groove 2010b existing on the peripheral surface of the wafer 200. Since the widths of the grooves 2010 are made uniform in the plane of the wafer 200, it is possible to make uniform the characteristics of a circuit in the substrate plane and to improve the yield rate.

(First Metal Film Forming Step S109)

Figure 20A:
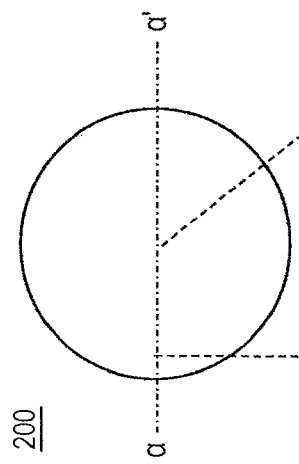
FIGS. 20A and 20B are explanatory views illustrating a processing state of a wafer according to an embodiment.
Figure 20B:
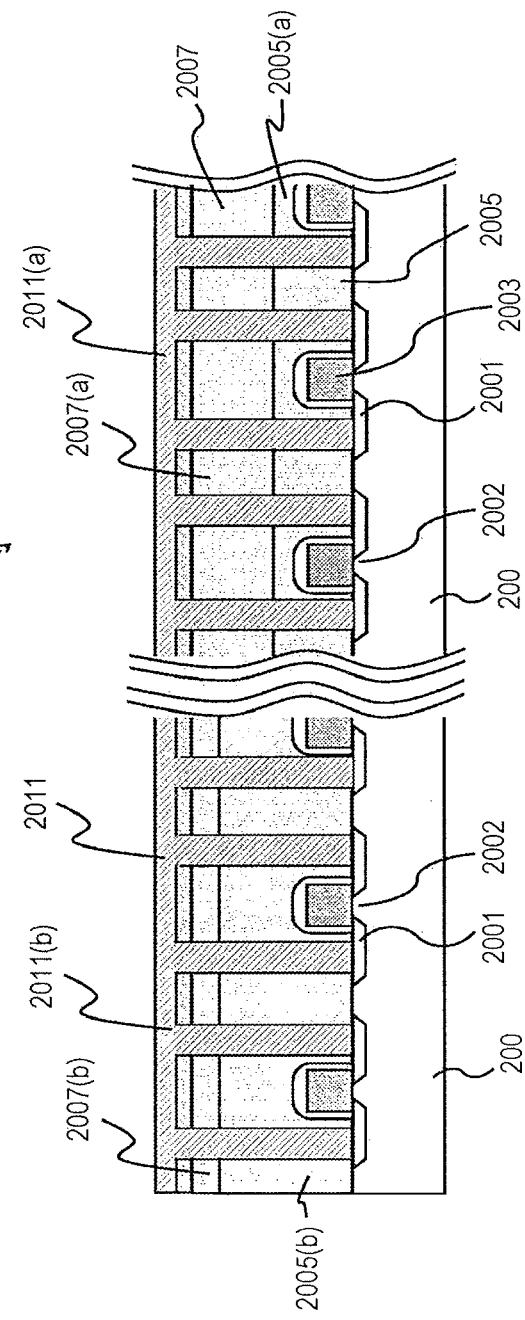

Subsequently, a first metal film forming step S109 will be described. FIGS. 20A and 20B are views illustrating the wafer 200 on which a metal film 2011 as a first metal film is formed. A metal film forming apparatus is a thin film forming apparatus such as an existing CVD apparatus or the like. Thus, descriptions thereof will be omitted.

After the etching process is finished, the wafer 200 is loaded into the metal film forming apparatus. A metal-containing gas is supplied into the process chamber of the metal film forming apparatus to form a metal film 2011. A metal has a conductive property. For example, tungsten (W) is used as the metal. The metal-containing gas is, for example, a tungsten-containing gas.

The metal-containing gas is supplied to the grooves 2010, thereby filling a metal component into the grooves 2010 as illustrated in FIGS. 20A and 20B and forming the metal film 2011. The metal film 2011 is used as a conductive wiring line which interconnects the circuit fanned in the upper layer and the source/drain regions 2001.

(Metal Film Polishing Step S110)

If the metal film 2011 is formed, the wafer 200 is unloaded from the metal film forming apparatus and is then transferred to a polishing apparatus. An extra metal film is polished by the polishing apparatus. The extra metal film refers to, e.g., a film protruding from the grooves 2010.

(Second Metal Film Forming Step S111)

Figure 21A:
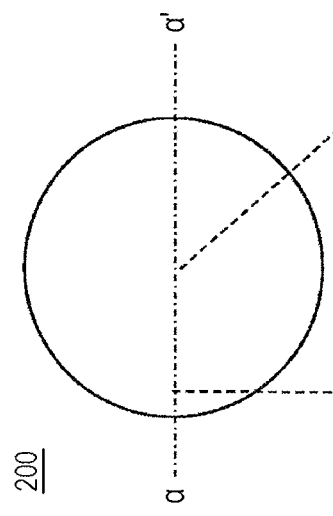
FIGS. 21A and 21B are explanatory views illustrating a processing state of a wafer according to an embodiment.
Figure 21B:
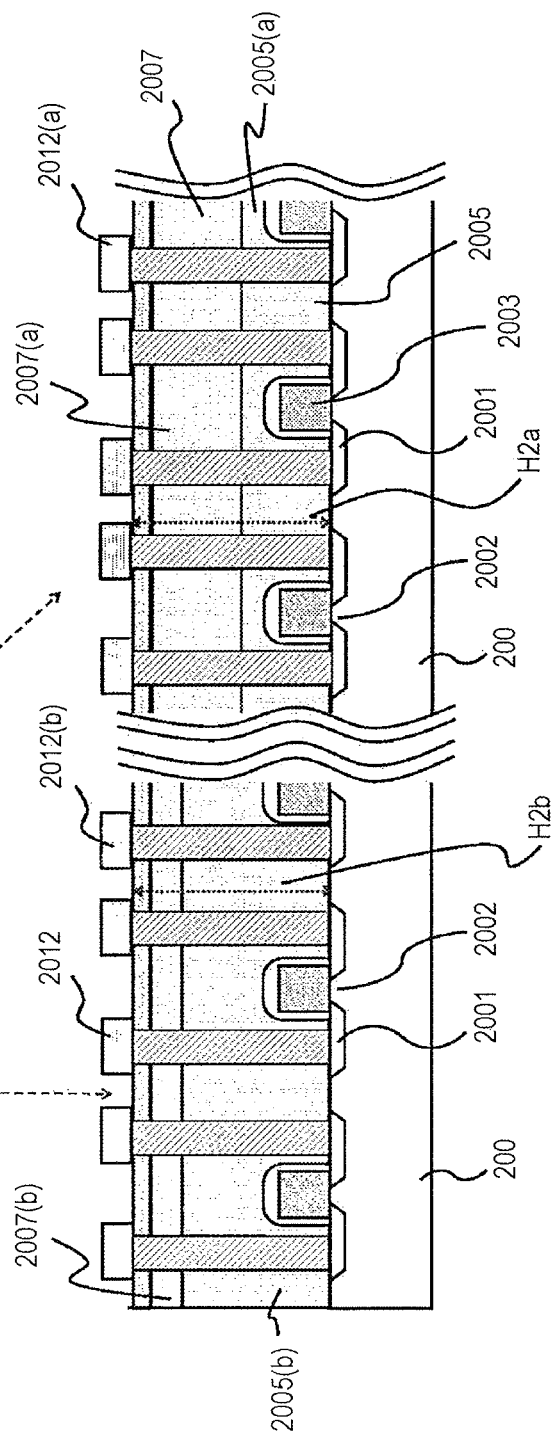

After the metal film polishing step S110, a second metal film 2012 is formed on the first metal film 2011 through a film forming process and a patterning process as illustrated in FIGS. 21A and 21B. The second metal film 2012 may be identical in composition with the first metal film 2011 or may differ in composition from that of the first metal film 2011 depending on the characteristics of a circuit.

As described above, by performing the substrate processing step including the second insulating film forming step S104, the distance from the substrate surface 200a to the lower end of the metal film 2012 can be made uniform in the plane of the wafer 200. That is to say, the height H2a from the substrate surface 200a to the lower end of the second metal film 2012a existing on the central surface of the wafer 200 and the height H2b from the substrate surface 200a to the lower end of the second metal film 2012b existing on the peripheral surface of the wafer 200 can be aligned with each other. Accordingly, the characteristics of the first metal film 2011 that interconnects the source/drain regions 2001 and the second metal film 2012 can be made uniform in the plane of the wafer 200. In this way, it is possible to make uniform the characteristics of many semiconductor devices manufactured from the wafer 200.

The term "characteristics" used herein refers to characteristics proportional to the height of the metal film and may refer to, for example, an electrical capacity.

While the conductive wiring line disposed between the source/drain regions 2001 and the second metal film 2012 has been described as an example in the present embodiment, the present disclosure is not limited thereto. For example, the source/drain regions may be replaced by metal wiring lines. In this case, one of the metal wiring lines may be a first metal wiring line and the other metal wiring line may be a second metal wiring line disposed in a layer above the first metal wiring line. The conductive layer according to the present embodiment may be disposed between the first metal wiring line and the second metal wiring line.

While the connection of gravity-direction upper and lower layers has been described as an example in the present embodiment, the present disclosure is not limited thereto. Needless to say, the present disclosure may be applied to, for example, a three-dimensional laminated circuit.

Subsequently, comparative examples will be described with reference to FIGS. 22A to 24. The comparative examples are directed to the cases where the second insulating film forming step S104 is not performed. Thus, the heights in the central surface and the peripheral surface of the wafer 200 differ from each other.

Figure 23A:
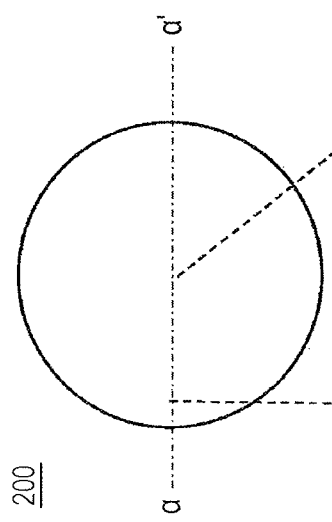
FIGS. 23A and 23B are explanatory views illustrating a processing state of a wafer according to a comparative example.
Figure 23B:
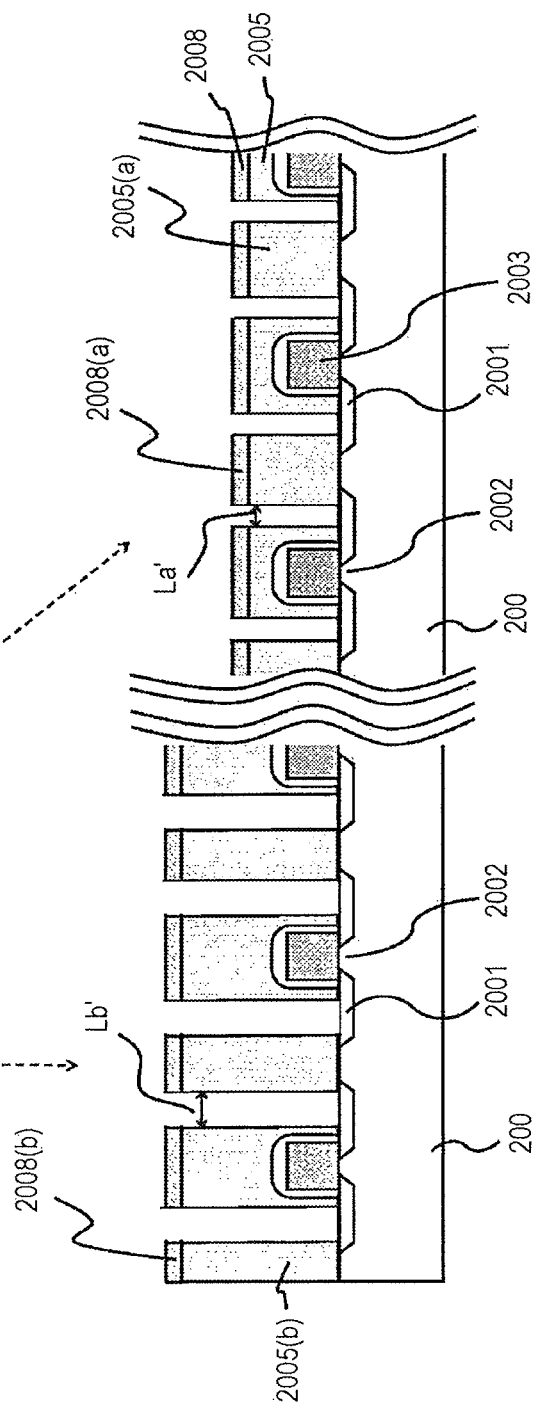

First, a first comparative example will be described with reference to FIGS. 22A and 22B. FIGS. 22A and 22B are views for comparison with FIGS. 18A and 18B. In FIGS. 22A and 22B, the heights of the insulating film 2005 are different on the central surface and the peripheral surface of the wafer 200. That is to say, the heights of the insulating film 2005a and the insulating film 2005b differ from each other. Thus, the moving distances of light 503 differ on the central surface of the wafer 200 and the peripheral surface of the wafer 200. Accordingly, the focal lengths differ on the central surface and the peripheral surface of the wafer 200. As a result, the width of the resist film 2009a and the width of the resist film 2009b differ from each other. If a process is performed with this resist film 2009, the width La' of the grooves on the central surface of the wafer 200 become different from the width Lb' of the grooves on the peripheral surface of the wafer 200 as illustrated in FIGS. 23A and 23B. Consequently, a variation in the characteristics of a semiconductor device occurs on the central surface of the wafer 200 and the peripheral surface of the wafer 200.

In contrast, in the present embodiment, the second insulating film forming step S104 is performed. It is therefore possible to make uniform the width of the grooves 2010 in the substrate plane. Thus, compared with the comparative example, it is possible to form a semiconductor device having uniform characteristics, thereby significantly contributing to the improvement of a yield rate.

Figures 24A, 24B:
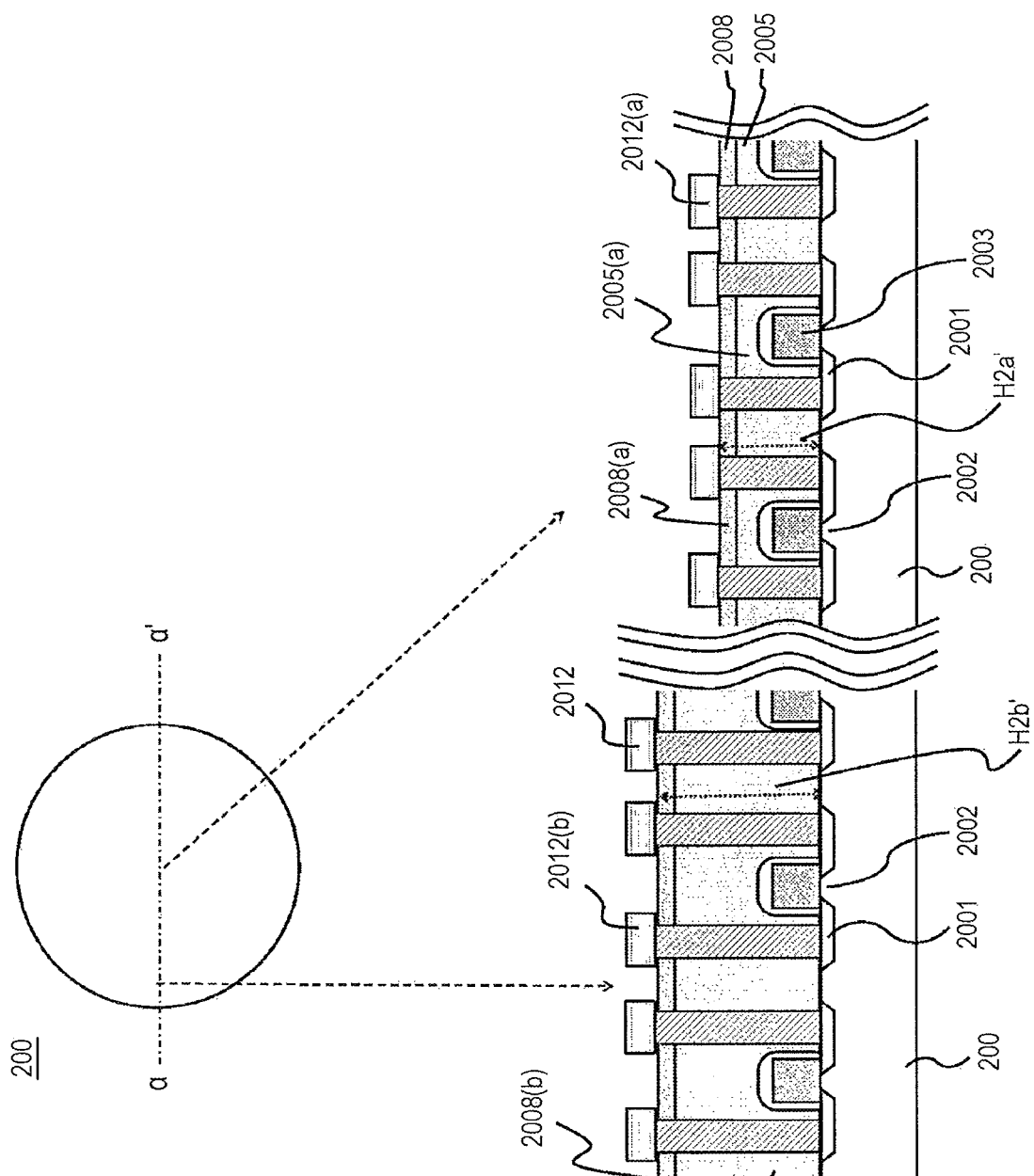
FIGS. 24A and 24B are explanatory views illustrating a processing state of a wafer according to a comparative example.

Subsequently, a second comparative example will be described. FIGS. 24A and 24B are views for comparison with FIGS. 21A and 21B. FIGS. 24A and 24B assume a case where there is no variation in the width of the resist film 2009a and the resist film 2009b.

As described above, the first metal film forming step S109, the metal film polishing step S110 and the second metal film forming step S111 are performed after the patterning step S108, thereby forming the first metal film 2011 and the second metal film 2012.

However, the insulating film 2005 has different thicknesses on the central surface and the peripheral surface of the wafer 200. That is to say, the heights of the insulating film 2005a and the insulating film 2005b differ from each other. Therefore, as illustrated in FIGS. 24A and 24B, the height H2a' of the first metal film 2011a (the height from the substrate surface 200a to the lower end of the second metal film 2012a) on the central surface of the wafer 200 and the height H2b' of the second metal film 2011b (the height from the substrate surface 200a to the lower end of the second metal film 2012b) on the peripheral surface of the wafer 200 become different from each other.

As described above, it is known that the electrical capacity of the first metal film 2011 depends on the height thereof. That is to say, under the circumstance illustrated in FIGS. 20A and 20B, the electrical capacity become different on the central surface of the wafer 200 and the peripheral surface of the wafer 200.

In contrast, in the present embodiment, the second insulating film forming step S104 is performed. It is therefore possible to make uniform the heights of the first metal film in the plane of the wafer 200. Thus, compared with the comparative example, it is possible to form a semiconductor device having uniform characteristics, thereby significantly contributing to the improvement of a yield rate.

Furthermore, in the present embodiment, it has been described that the first insulating film forming step S101 to the second metal film forming step S111 are performed in the individual apparatuses. However, the present disclosure is not limited thereto. As illustrated in FIG. 25, the first insulating film forming step S101 to the second metal film forming step S111 may be performed by a single substrate processing system. The system 600 includes a host device 601 configured to control the system. The substrate processing apparatus or the substrate processing system, which processes a substrate, includes an insulating film forming apparatus 602 configured to perform the first insulating film forming step S101, a polishing apparatus 603 (corresponding to the polishing apparatus 400 of the present embodiment), configured to perform the insulating film polishing step S102, a film thickness measuring apparatus 604 configured to perform the film thickness measuring step S103, an insulating film forming apparatus 605 (corresponding to the substrate processing apparatus 900 of the present embodiment) configured to perform the second insulating film forming step S104, a film thickness measuring apparatus 606 configured to perform the film thickness measuring step S105, a nitride film forming apparatus 607 configured to perform the nitride film forming step S106, a film thickness measuring apparatus 608 configured to perform the film thickness measuring step S107, a patterning system 609 configured to perform the patterning step S108, a metal film forming apparatus 610 configured to performing the first metal film forming step S109, a polishing apparatus 611 configured to perform the metal film polishing step S110, and a metal film forming system 612 configured to perform the second metal film forming step S111. Moreover, the substrate processing apparatus or the substrate processing system includes a network 613 for exchanging information between the respective apparatuses or systems.

The host device 601 includes a controller 6001 configured to control information transmission of the substrate processing apparatus or substrate processing system.

The controller 6001 serving as a control part (control means) is configured as a computer including a central processing unit (CPU) 6001a, a random access memory (RAM) 6001b, a memory device 6001c, and an I/O port 6001d. The RAM 6001b, the memory device 6001c and the I/O port 6001d are configured to exchange data with the CPU 6001a via an internal bus. An input/output device 6002 configured by, e.g., a touch panel or the like, and an external memory device 6003 are connected to the controller 6001. In addition, there is installed a transmission/reception part 6004 configured to transmit and receive information to and from other apparatuses or systems through the network.

The memory device 6001c is configured by, for example, a flash memory, a hard disk drive (HDD), or the like. A program for issuing an operation command to the substrate processing apparatus and the like are readably stored in the memory device 6001c. Further, the RAM 6001b is configured as a memory area (work area) in which a program, data, or the like read by the CPU 6001a is temporarily stored.

The CPU 6001a is configured to read the control program from the memory device 6001c and to execute the same. The CPU 6001a is configured to read the program from the memory device 6001c according to an input of an operation command from the input/output device 6002, or the like. Furthermore, the CPU 6001a is configured to control the information transmission operations of the respective apparatuses in conformity with the contents of the read program.

In addition, the controller 6001 is not limited to being configured as a dedicated computer and may be configured as a general-purpose computer. For example, the controller 6001 according to the present embodiment may be configured by preparing the external memory device 6003 (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory or a memory card) which stores the program described above, and installing the program on the general-purpose computer using the external memory device 6003. Furthermore, a means for supplying the program to the computer is not limited to the case of supplying the program through the external memory device 6003. For example, the program may be supplied using a communication means such as the Internet or a dedicated line without going through the external memory device 6003. Moreover, the memory device 6001c or the external memory device 6003 is configured as a non-transitory computer-readable recording medium. Hereinafter, these will be generally and simply referred to as a recording medium. Additionally, the term "recording medium" used herein may be intended to include the memory device 6001c alone, the external memory device 6003 alone, or both the memory device 6001c and the external memory device 6003.

The apparatuses of the system 600 may be appropriately selected. The apparatuses having redundant functions may be aggregated into one apparatus. Moreover, the apparatuses may be managed by another system rather than the present system 600. In this case, the apparatuses may transmit information to another system via a higher network 614.

While descriptions have been made by dividing the wafer 200 into the central surface and the peripheral surface, the present disclosure is not limited thereto. The thickness of the insulating film may be controlled in radially subdivided regions. For example, the wafer 200 may be divided into three or more regions such as a central surface, a peripheral surface and a surface between the central surface and the peripheral surface.

While the nitride film forming step S106 is performed in the present embodiment, the present disclosure is not limited thereto. The nitride film forming step S106 may not be performed. In this case, it is advisable that the overlapping heights of the insulating film 2005 and the insulating film 2007 are aligned within an extent that does not cause a variation in the characteristics of the first metal film.

While the film thickness measuring step S105 is performed in the present embodiment, the present disclosure is not limited thereto. The film thickness measuring step S105 may not be performed. In this case, it is advisable that the overlapping heights of the insulating film 2005 and the insulating film 2007 are aligned within an extent that does not cause a variation in the characteristics of the first metal film.

While the film thickness measuring step S107 is performed in the present embodiment, the present disclosure is not limited thereto. The film thickness measuring step S107 may not be performed. In this case, it is advisable that the overlapping heights of the insulating film 2005 and the insulating film 2007 are aligned within an extent that does not cause a variation in the characteristics of the first metal film. Moreover, it is advisable that the overlapping heights of the insulating film 2005, the insulating film 2007 and the nitride film formed at the nitride film forming step S106 are aligned within an extent that does not cause a variation in the characteristics of the first metal film.

While the silicon nitride film has been described as an example of the hard mask, the present disclosure is not limited thereto. The hard mask may be, for example, a silicon oxide film.

At the step of forming the film, it may be possible to perform a film forming process such as CVD or the like. When forming a thin film by alternately supplying gases, it may be possible to perform a click process, an oxidizing process, a nitriding process or an oxy-nitriding process to modify the film. According to these processes, it is possible to perform correction even when unevenness cannot be reduced through migration or sputtering.

When performing a sputtering process or a film forming process, it may be possible to combine anisotropic processing or isotropic processing therewith. By combining the anisotropic processing or the isotropic processing, it may be possible to precisely perform correction.

While the silicon oxide film is used as the insulating film, a pattern may be formed by an oxide film, a nitride film, a carbide film, an oxynitride film or a composite film thereof, which contains different elements, as long as it is possible to achieve the purpose thereof.

While one of processes of manufacturing a semiconductor device has been described above, the present disclosure is not limited thereto. The present disclosure may be applied to substrate processing techniques such as a patterning process of a liquid crystal panel manufacturing process, a patterning process of a solar cell manufacturing process, a patterning process of a power device manufacturing process, or the like.

While the first gas supply system and the second gas supply system are controlled and the central zone heater 213a and the outer zone heater 213b are controlled so that the exposure amount of the gas per unit area varies depending on the distribution of the first insulating film, the present disclosure is not limited thereto. For example, when it is difficult for the gas supply part to change the amount or concentration of the gas, control may be executed so that the gas supply amounts of the first gas supply system and the second gas supply system become equal to each other and so that the temperatures of the central zone heater 213a and the outer zone heater 213b become different from each other.

While different apparatuses are used at the first insulating film forming step and the second insulating film forming step described above, the present disclosure is not limited thereto. For example, the first insulating film forming step may be performed by the substrate processing apparatus 900.

While the foregoing descriptions have been made using the 300 mm wafer, the present disclosure is not limited thereto. A large substrate such as a 450 mm wafer or the like may be more effective. In the case of a large substrate, the influence of the insulating film polishing step S102 becomes more prominent. That is to say, the film thickness difference of the insulating film 2005a and the insulating film 2005b becomes larger. By performing the second insulating film forming step, it is possible to suppress a variation in the in-plane characteristics even in a large substrate.

<Aspects Of The Present Disclosure>

Hereinafter, some aspects of the present disclosure will be additionally described as supplementary notes.

(Supplementary Note 1)

According to one aspect of the present disclosure, there is provided a method of manufacturing a semiconductor device or a substrate processing method, including:

forming a first insulating film as a portion of a laminated insulating film on a substrate in which a plurality of circuit configurations is formed;

polishing the first insulating film;

measuring a film thickness distribution of the first insulating film; and forming a second insulating film as a portion of the laminated insulating film on the polished first insulating film at a film thickness distribution differing from the film thickness distribution of the first insulating film to correct a film thickness of the laminated insulating film.

(Supplementary Note 2)

In the method of Supplementary Note 1, the circuit configurations may include a gate electrode.

(Supplementary Note 3)

In the method of Supplementary Note 1 or 2, in the act of forming the second insulating film, a height distribution of the second insulating film in a plane of the substrate may be set to fall within a predetermined range.

(Supplementary Note 4)

The method of any one of Supplementary Notes 1 to 3 may further include:

forming a groove on the substrate by patterning the substrate after the act of forming the second insulating film; and forming a first metal film in the groove after the act of patterning the substrate.

(Supplementary Note 5)

The method of any one of Supplementary Notes 1 to 4 may further include:

forming a second metal film electrically connected to the first metal film, after the act of forming the first metal film.

(Supplementary Note 6)

In the method of any one of Supplementary Notes 1 to 5, in the act of forming the second insulating film, a distance from a surface of the substrate to an upper end of the second insulating film may be set to fall within a predetermined range.

(Supplementary Note 7)

In the method of any one of Supplementary Notes 1 to 6, in the act of forming the second insulating film, if the film thickness distribution of the first insulating film is such that a film thickness of the first insulating film is larger on a peripheral surface of the substrate than on a central surface of the substrate, an exposure amount of a main component of a process gas per unit area of the substrate may be made smaller on the peripheral surface than on the central surface.

(Supplementary Note 8)

In the method of any one of Supplementary Notes 1 to 7, in the act of forming the second insulating film, if the film thickness distribution of the first insulating film is such that a film thickness of the first insulating film is larger on a peripheral surface of the substrate than on a central surface of the substrate, an amount of a process gas supplied to the peripheral surface may be made smaller than an amount of a process gas supplied to the central surface.

(Supplementary Note 9)

In the method of any one of Supplementary Notes 1 to 8, in the act of forming the second insulating film, if the film thickness distribution of the first insulating film is such that a film thickness of the first insulating film is larger on a peripheral surface of the substrate than on a central surface of the substrate, a concentration of a main component of a process gas supplied to the peripheral surface may be made smaller than a concentration of a main component of a process gas supplied to the central surface.

(Supplementary Note 10)

In the method of Supplementary Note 9, when controlling the concentration of the process gas, a supply amount of an inert gas added to the process gas supplied to the peripheral surface may be made larger than a supply amount of an inert gas added to the process gas supplied to the central surface.

(Supplementary Note 11)

In the method of any one of Supplementary Notes 1 to 10, in the act of forming the second insulating film, if the film thickness distribution of the first insulating film is such that a film thickness of the first insulating film is larger on a peripheral surface of the substrate than on a central surface of the substrate, a temperature of the central surface of the substrate may be made higher than a temperature of the peripheral surface of the substrate.

(Supplementary Note 12)

In the method of any one of Supplementary Notes 7 to 11, the process gas may be a silicon-containing gas.

(Supplementary Note 13)

In the method of any one of Supplementary Notes 1 to 6, in the act of forming the second insulating film, if the film thickness distribution of the first insulating film is such that a film thickness of the first insulating film is smaller on a peripheral surface of the substrate than on a central surface of the substrate, an exposure amount of a main component of a process gas per unit area of the substrate may be made larger on the peripheral surface than on the central surface.

(Supplementary Note 14)

In the method of any one of Supplementary Notes 1 to 6 and 13, in the act of forming the second insulating film, if the film thickness distribution of the first insulating film is such that a film thickness of the first insulating film is smaller on a peripheral surface of the substrate than on a central surface of the substrate, an amount of a process gas supplied to the peripheral surface may be made larger than an amount of a process gas supplied to the central surface.

(Supplementary Note 15)

In the method of any one of Supplementary Notes 1 to 6 and 13 to 14, in the act of forming the second insulating film, if the film thickness distribution of the first insulating film is such that a film thickness of the first insulating film is smaller on a peripheral surface of the substrate than on a central surface of the substrate, a concentration of a main component of a process gas supplied to the peripheral surface may be made larger than a concentration of a main component of a process gas supplied to the central surface.

(Supplementary Note 16)

In the method of Supplementary Note 15, when controlling the concentration of the process gas, a supply amount of an inert gas added to the process gas supplied to the central surface may be made larger than a supply amount of an inert gas added to the process gas supplied to the peripheral surface.

(Supplementary Note 17)

In the method of any one of Supplementary Notes 1 to 6 and 13 to 16, in the act of forming the second insulating film, if the film thickness distribution of the first insulating film is such that a film thickness of the first insulating film is smaller on a peripheral surface of the substrate than on a central surface of the substrate, a temperature of the peripheral surface of the substrate may be made higher than a temperature of the central surface of the substrate.

(Supplementary Note 18)

In the method of any one of Supplementary Notes 13 to 17, the process gas may be a silicon-containing gas.

(Supplementary Note 19)

According to another aspect of the present disclosure, there is provided a substrate processing system, including:

a first apparatus configured to form a first insulating film as a portion of a laminated insulating film on a substrate in which a plurality of circuit configurations is formed;

a second apparatus configured to polish the first insulating film;

a third apparatus configured to measure a film thickness distribution of the first insulating film; and a fourth apparatus configured to form a second insulating film as a portion of the laminated insulating film on the polished first insulating film at a film thickness distribution differing from the film thickness distribution of the first insulating film to correct a film thickness of the laminated insulating film.

(Supplementary Note 20)

According to another aspect of the present disclosure, there is provided a substrate processing apparatus, including:

a substrate mounting part accommodated within a process chamber and configured to mount thereon a substrate including a plurality of circuit configurations and a polished first insulating film as a portion of a laminated insulating film;

a reception part configured to receive data on a film thickness distribution of the first insulating film; and a gas supply part configured to supply a gas so as to form a second insulating film as a portion of the laminated insulating film on the first insulating film at a film thickness distribution differing from the film thickness distribution of the first insulating film to correct a film thickness of the laminated insulating film.

(Supplementary Note 21)

According to another aspect of the present disclosure, there is provided a substrate processing apparatus, including:

a substrate mounting part accommodated within a process chamber and configured to mount thereon a substrate including a first configuration and a first insulating film formed on the first configuration;

a reception part configured to receive data on a film thickness distribution of the first insulating film from a host device; and a gas supply part configured to form a second insulating film on the first insulating film by controlling a distribution of exposure amounts of a gas per unit area of the substrate according to the data on the film thickness distribution received from the reception part.

(Supplementary Note 22)

According to another aspect of the present disclosure, there is provided a program which causes a computer to execute:

a process of forming a first insulating film as a portion of a laminated insulating film on a substrate in which a plurality of circuit configurations is formed;

a process of polishing the first insulating film;

a process of measuring a film thickness distribution of the first insulating film; and a process of forming a second insulating film as a portion of the laminated insulating film on the polished first insulating film at a film thickness distribution differing from the film thickness distribution of the first insulating film to correct a film thickness of the laminated insulating film.

(Supplementary Note 23)

According to another aspect of the present disclosure, there is provided a recording medium storing a program which causes a computer to execute:

a process of forming a first insulating film as a portion of a laminated insulating film on a substrate in which a plurality of circuit configurations is formed;

a process of polishing the first insulating film;

a process of measuring a film thickness distribution of the first insulating film; and a process of forming a second insulating film as a portion of the laminated insulating film on the polished first insulating film at a film thickness distribution differing from the film thickness distribution of the first insulating film to correct a film thickness of the laminated insulating film.

(Supplementary Note 24)

According to another aspect of the present disclosure, there is provided a substrate processing apparatus, including:

(i) a process chamber;

(ii) a substrate mounting part including a substrate mounting stand installed within the process chamber and a substrate mounting surface configured to mount thereon a substrate including a plurality of circuit configurations and "a polished first insulating film as a portion of a laminated insulating film";

(iii) a first gas supply system including a first gas supply pipe, a first process gas flow rate control part installed in the first gas supply pipe, a second gas supply pipe and a second process gas flow rate control part installed in the second gas supply pipe;

(iv) a second gas supply system including a third gas supply pipe, a third process gas flow rate control part installed in the third gas supply pipe, a fourth gas supply pipe and a fourth process gas flow rate control part installed in the fourth gas supply pipe;

(v) a buffer chamber including a shower head communicating with the first gas supply pipe and the third gas supply pipe and facing the substrate mounting surface, and a gas supply path communicating with the second gas supply pipe and the fourth gas supply pipe and facing the substrate mounting surface;

(vi) a reception part electrically connected to a host device and configured to receive information on a film thickness distribution of the first insulating film; and (vii) a control part including a table configured to record a relationship between "film thickness distribution information of the first insulating film" and "control values of a gas supply part", a memory part configured to store the table, a comparison part configured to compare "the received film thickness distribution information of the first insulating film" with the table to calculate control values to be instructed to the gas control part, and a transmission/reception part configured to transmit the calculated control values to respective gas supply control parts.

According to the present disclosure in some embodiments, it is possible to suppress a variation in characteristics of a semiconductor device in a substrate plane.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such fauns or modifications as would fall within the scope and spirit of the disclosures.

What is claimed is:

1. A method of manufacturing a semiconductor device, comprising:
    forming a first insulating film as a portion of a laminated insulating film on a substrate in which a plurality of circuit configurations is formed;
    polishing the first insulating film;
    measuring a height distribution of the first insulating film, wherein the height is measured from a surface of the substrate contacting the first insulating film to a top surface of the first insulating film; and
    forming a second insulating film as a portion of the laminated insulating film on the polished first insulating film at a film thickness distribution differing from the height distribution of the first insulating film to correct a film thickness of the laminated insulating film, and thereby provide a uniform height of the laminated insulating film.

2. The method of claim 1, further comprising:
    forming a groove on the substrate by patterning the substrate after the act of forming the second insulating film; and
    forming a first metal film in the groove after the act of patterning the substrate.

3. The method of claim 2, further comprising:
    forming a second metal film electrically connected to the first metal film, after the act of forming the first metal film.

4. The method of claim 1, wherein in the act of forming the second insulating film, an exposure amount of a main component of a process gas per unit area of the substrate is made smaller on a peripheral surface of the substrate than on a central surface of the substrate, when the height distribution of the first insulating film is such that the height is larger on the peripheral surface than on the central surface.

5. The method of claim 4, further comprising:
    forming a groove on the substrate by patterning the substrate after the act of forming the second insulating film; and
    forming a first metal film in the groove after the act of patterning the substrate.

6. The method of claim 5, further comprising:
    forming a second metal film electrically connected to the first metal film, after the act of forming the first metal film.

7. The method of claim 1, wherein in the act of forming the second insulating film, an amount of a process gas supplied to a peripheral surface of the substrate is made smaller than an amount of a process gas supplied to a central surface of the substrate, when the height distribution of the first insulating film is such that the height is larger on the peripheral surface than on the central surface.

8. The method of claim 1, wherein in the act of forming the second insulating film, a concentration of a main component of a process gas supplied to a peripheral surface of the substrate is made smaller than a concentration of a main component of a process gas supplied to a central surface of the substrate, when the height distribution of the first insulating film is such that the height is larger on the peripheral surface than on the central surface.

9. The method of claim 8, wherein when controlling the concentration of the process gas, a supply amount of an inert gas added to the process gas supplied to the peripheral surface is made larger than a supply amount of an inert gas added to the process gas supplied to the central surface.

10. The method of claim 1, wherein in the act of forming the second insulating film, a temperature of a central surface of the substrate is made higher than a temperature of a peripheral surface of the substrate, when the height distribution of the first insulating film is such that the height is larger on the peripheral surface than on the central surface.

11. The method of claim 1, wherein in the act of forming the second insulating film, an exposure amount of a main component of a process gas per unit area of the substrate is made larger on a peripheral surface of the substrate than on a central surface of the substrate, when the height distribution of the first insulating film is such that the height is smaller on the peripheral surface than on the central surface.

12. The method of claim 11, further comprising:
    forming a groove on the substrate by patterning the substrate after the act of forming the second insulating film; and
    forming a first metal film in the groove after the act of patterning the substrate.

13. The method of claim 12, further comprising:
    forming a second metal film electrically connected to the first metal film, after the act of forming the first metal film.

14. The method of claim 1, wherein in the act of forming the second insulating film, an amount of a process gas supplied to a peripheral surface of the substrate is made larger than an amount of a process gas supplied to a central surface of the substrate, when the height distribution of the first insulating film is such that the height is smaller on the peripheral surface than on the central surface.

15. The method of claim 1, wherein in the act of forming the second insulating film, a concentration of a main component of a process gas supplied to a peripheral surface of the substrate is made larger than a concentration of a main component of a process gas supplied to a central surface of the substrate, when the height distribution of the first insulating film is such that the height is smaller on the peripheral surface than on the central surface.

16. The method of claim 15, wherein when controlling the concentration of the process gas, a supply amount of an inert gas added to the process gas supplied to the central surface is made larger than a supply amount of an inert gas added to the process gas supplied to the peripheral surface.

17. The method of claim 1, wherein in the act of forming the second insulating film, a temperature of the peripheral surface of the substrate is made higher than a temperature of the central surface of the substrate, when the height distribution of the first insulating film is such that the height is smaller on a peripheral surface of the substrate than on a central surface of the substrate.

18. A method of manufacturing a semiconductor device, comprising forming a second insulating film on a substrate in which a plurality of circuit configurations and a polished first insulating film as a portion of a laminated insulating film are formed,
- wherein the second insulating film is formed as a portion of the laminated insulating film on a first insulating film at a film thickness distribution differing from a height distribution of the first insulating film to correct a film thickness of the laminated insulating film, and thereby provide a uniform height of the laminated insulating film, and
- wherein the height is measured from a surface of the substrate contacting the first insulating film to a top surface of the first insulating film.

* * * * *